US011031955B2

United States Patent
Hui et al.

(10) Patent No.: US 11,031,955 B2
(45) Date of Patent: Jun. 8, 2021

(54) INCREMENTAL REDUNDANCY AND VARIATIONS FOR POLAR CODES

(71) Applicant: TELEFONAKTIEBOLAGET LM ERICSSON (PUBL), Stockholm (SE)

(72) Inventors: Dennis Hui, Sunnyvale, CA (US); Yufei Blankenship, Kildeer, IL (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 7 days.

(21) Appl. No.: 16/346,635

(22) PCT Filed: Nov. 10, 2017

(86) PCT No.: PCT/IB2017/057058
§ 371 (c)(1),
(2) Date: May 1, 2019

(87) PCT Pub. No.: WO2018/087718
PCT Pub. Date: May 17, 2018

(65) Prior Publication Data
US 2020/0067529 A1 Feb. 27, 2020

Related U.S. Application Data

(60) Provisional application No. 62/421,211, filed on Nov. 11, 2016.

(51) Int. Cl.
| | |
|---|---|
| *H03M 13/13* | (2006.01) |
| *H03M 13/29* | (2006.01) |
| *H04L 1/00* | (2006.01) |
| *H04L 1/18* | (2006.01) |

(52) U.S. Cl.
CPC ....... *H03M 13/13* (2013.01); *H03M 13/2903* (2013.01); *H04L 1/0041* (2013.01); *H04L 1/0065* (2013.01); *H04L 1/1819* (2013.01)

(58) Field of Classification Search
CPC ............ H03M 13/13; H03M 13/2903; H03M 13/6306; H04L 1/0041; H04L 1/0065; H04L 1/1819; H04L 1/1845
See application file for complete search history.

(56) References Cited

U.S. PATENT DOCUMENTS

2007/0253423 A1 11/2007 Chindapol et al.
2018/0248567 A1* 8/2018 Qu .................... H03M 13/11
(Continued)

OTHER PUBLICATIONS

H. Saber and I. Marsland, "An Incremental Redundancy Hybrid ARQ Scheme via Puncturing and Extending of Polar Codes," in IEEE Transactions on Communications, vol. 63, No. 11, pp. 3964-3973, Nov. 2015. (Year: 2015).*
(Continued)

*Primary Examiner* — Cynthia Britt

(57) ABSTRACT

Methods of transmitting blocks of incremental redundant coded bits are provided. Methods include concatenating, using an outer encoder, bits of an input bit vector to an outer encoded bit vector that has fewer bits than the input bit vector, wherein the outer encoded bit vector includes a mixture of information bits from the input bit vector. Methods include encoding the outer encoded bit vector into inner encoded data that is mapped to multiple data transmission channels that each include a channel reliability value. A first portion of the data transmission channels is used to transmit information bits corresponding to the outer encoded bit vector and a second portion of the data transmission channels is used to transmit frozen bits that include no information.

17 Claims, 15 Drawing Sheets

(56) References Cited

U.S. PATENT DOCUMENTS

2019/0140663 A1* 5/2019 Noh .................. H04L 1/007
2019/0158128 A1* 5/2019 Ge .................. H03M 13/13
2019/0245650 A1* 8/2019 Hui .................. H04L 1/0066

OTHER PUBLICATIONS

Bin et al., "Capacity-achieving rateless polar codes," IEEE International Symposium on Information Theory (ISIT), Jul. 10, 2016, pp. 46-50.

Ma et al., "An Incremental Redundancy HARQ Scheme for Polar Code," arXiv preprint arXiv:1708.09679, 6 pages, Aug. 31, 2017.

Bakshi et al., "Concatenated polar codes," IEEE International Symposium on Information Theory (ISIT), Jun. 13, 2010, pp. 918-922.

Hong et al., "Capacity-Achieving Rate-Compatible Polar Codes," IEEE Transactions on Information Theory, Dec. 2017, vol. 63, pp. 7620-7632.

Arikan, "Channel Polarization: A Method for Constructing Capacity-Achieving Codes for Symmetric Binary-Input Memoryless Channels," IEEE Transactions on Information Theory, Jul. 2009, vol. 55, pp. 3051-3073.

Leroux et al., "A Semi-Parallel Successive-Cancellation Decoder for Polar Codes," IEEE Transactions on Signal Processing, vol. 61, No. 2, Jan. 15, 2013, pp. 289-289.

Tal et al., "List Decoding of Polar Codes," IEEE International Symposium on Information Theory Proceedings, Jul. 31, 2011, pp. 1-5.

* cited by examiner

INCREMENTAL REDUNDANCY AND VARIATIONS FOR POLAR CODES

This application is a 371 of International Application No. PCT/162017/057058, filed Nov. 10, 2017, which claims the benefit of U.S. Provisional Application No. 62/421,211, filed Nov. 11, 2016, the disclosure of which is fully incorporated herein by reference.

TECHNICAL FIELD

The disclosed subject matter relates generally to telecommunications. Certain embodiments relate more particularly to concepts such as Polar codes, hybrid automatic repeat request (HARQ), Incremental Redundancy, and System Information Blocks.

BACKGROUND

Polar codes, proposed by Arikan [1], are the first class of constructive coding schemes that are provable to achieve the symmetric capacity of binary-input discrete memoryless channels under a low-complexity successive cancellation (SC) decoder. However, the finite-length performance of polar codes under SC may not be competitive compared to other modern channel coding schemes such as low-density parity-check (LDPC) codes and Turbo codes. Additionally, a SC list (SCL) decoder was proposed, which can approach the performance of an optimal maximum-likelihood (ML) decoder. By concatenating a simple CRC coding, it was shown that the performance of concatenated polar code may be competitive with that of well-optimized LDPC and Turbo codes. As a result, polar codes are being considered as a candidate for future wireless communication systems (e.g., 5th generation or 5G systems).

SUMMARY

Some embodiments are directed to methods and/or apparatuses that support incremental redundancy HARQ for data transmission. Such methods and/or apparatuses can also be applied in variations of IR, where multiple blocks of coded bits need to be generated and transmitted separately for a given transport block.

Some embodiments disclosed herein include methods of transmitting blocks of incremental redundant coded bits. Such methods may include concatenating, using an outer encoder, bits of an input bit vector to an outer encoded bit vector that has fewer bits than the input bit vector, wherein the outer encoded bit vector includes a mixture of information bits from the input bit vector and encoding the outer encoded bit vector into inner encoded data that is mapped to a plurality of data transmission channels that each include a channel reliability value, wherein a first portion of the plurality of data transmission channels is used to transmit information bits corresponding to the outer encoded bit vector and a second portion of the plurality of data transmission channels is used to transmit frozen bits that include known values.

In some embodiments, encoding the outer encoded data comprises using a polar encoder that is operable to encode data for transmission using the data transmission channels. Some embodiments provide the polar encoder is configured to identify ones of the data transmission channels as the first portion of data transmission channels and other ones of the plurality of data transmission channels as the second portion of the data transmission channels.

Some embodiments include transmitting the inner encoded data to a receiver that includes a polar decoder that is configured decode the inner encoded data into outer encoded data and an outer decoder that is configured to decode the outer encoded data that is generated by the polar decoder. In some embodiments, transmitting the inner coded data comprises transmitting a plurality of data transmissions that each include different information from one another. Some embodiments provide that ones of the data transmissions are performed sequentially and that contents of a subsequent one of the data transmissions are based on a performance of a previously performed one of the data transmissions. Some embodiments provide that ones of the data transmissions are performed sequentially and that one of the data transmissions occurring after a first data transmission is performed responsive to not receiving a message from a receiver acknowledging the first data transmission.

In some embodiments, encoding the outer encoded bit vector into inner encoded data that is mapped to multiple data transmission channels includes encoding the outer encoded bit vector into first transmission data that is configured to be transmitted in a first data transmission, encoding the outer encoded bit vector into second transmission data that is configured to be transmitted in a second data transmission, and encoding the outer encoded bit vector into third transmission data that is configured to be transmitted in a third data transmission. In some embodiments, encoding the outer encoded bit vector into inner encoded data includes identifying a first subset of the plurality of data transmission channels as the first portion of the data transmission channels for the first data transmission, identifying a second subset of the plurality of data transmission channels as the first portion of the data transmission channels for the second data transmission, and identifying a third subset of the plurality of data transmission channels as the first portion of the data transmission channels for the third data transmission. Some embodiments provide that the first subset of the data transmission channels is different than the second nd third subsets of the data transmission channels and that the second and third subsets of the data transmission channels are different from one another.

In some embodiments, a reliability value corresponding to ones of the data transmission channels indicates a predicted reliability corresponding to the ones of the data transmission channels. Some embodiments provide that the first portion of the data transmission channels comprised ones of the data transmission channels that include reliability values that are greater than reliability values of the second portion of the data transmission channels. In some embodiments, the first portion of the data transmission channels are a given percentage of a total number of the data transmission channels.

Some embodiments provide that the first portion of the plurality of data transmission channels comprises ones of the data transmission channels that include reliability values that are greater than a given reliability threshold.

Some embodiments provide that concatenating the bits of the input bit vector is performed using a generating matrix that is used in a decoding operation at a receiver.

In some embodiments, the second portion of the data transmission channels that is used to transmit frozen bits that include no information is encoded by a generating matrix that is known by a polar decoder at a receiver of the data transmission.

Some embodiments provide that concatenating the bits of the input bit vector comprises encoding less than all of the bits of the input bit vector using a generating matrix.

In some embodiments, concatenating the bits of the input bit vector comprises encoding all of the bits of the input bit vector using a random number.

Some embodiments provide that the blocks of incremental redundant coded bits are used in a hybrid automatic repeat request (HARQ) re-transmission protocol to retransmit redundant information for the same block of information bits.

In some embodiments, the blocks of incremental redundant coded bits are used in a transmission of broadcast information in a wireless communication system. Some embodiments provide that the transmission of broadcast information in a wireless communication system comprises a system information block (SIB) of a 4G and/or 5G cellular system.

In some embodiments, the blocks of incremental redundant coded bits are used in repeated transmission in uplink or downlink of a narrow-band internet of things (NB-IoT) system to extend coverage of the system.

Some embodiments are directed to a communication device that is operative to perform methods disclosed herein.

Some embodiments are directed to a communication device comprising an encoding module for performing methods disclosed herein.

Some embodiments are directed to a computer program for a communication device. The computer program includes computer program code which when run in the communication device, causes the communication device to perform methods disclosed herein.

Some embodiments are directed to methods of decoding multiple information bits that are transmitted over multiple polar coded bit-channels. Such methods may include receiving first transmitted codes into a polar decoder, outputting by the polar decoder a plurality of Log Likelihood Ratio (LLR) values that correspond to bits received into a polar encoder and that correspond to a likelihood of the corresponding one of the bits being correct, receiving, into a linear decoder, the plurality of LLR values and generating by the linear decoder an estimated input data vector that corresponds to an input data vector received at a transmitter that transmitted the plurality of first transmitted codes.

Some embodiments include receiving second transmitted codes into the polar decoder, outputting by the polar encoder a plurality of Log Likelihood Ratio (LLR) values that correspond to bits received into the polar encoder and that correspond to a likelihood of the corresponding one of the bits being correct, receiving, into the linear decoder, the plurality of LLR values corresponding to the plurality of second transmitted codes, and generating by the linear decoder an estimated input data vector that corresponds to an input data vector received at the transmitter that transmitted the plurality of second transmitted codes.

Some embodiments are direct to systems for communicating using concatenated polar coding. Such systems include a transmitter comprising a linear encoder that is configured to encode bits of an input bit vector into an outer encoded bit vector that has fewer bits than the input bit vector, and a polar encoder that is configured to encode the outer encoded bit vector into inner encoded data that is mapped to a plurality of data transmission channels that each include a channel reliability value, wherein a first portion of the plurality of data transmission channels is used to transmit information bits corresponding to the outer encoded bit vector and a second portion of the data transmission channels is used to transmit frozen bits that include known values. Systems may include a receiver comprising a polar decoder that is configured to receive data generated by the polar encoder and to output a plurality of Log Likelihood Ratio (LLR) values that correspond to bits received into the polar encoder and that correspond to a likelihood of the corresponding one of the bits is correct and a linear decoder that is configured to receive the plurality of LLR values and to generate an estimated input data vector that corresponds to an input data vector received at the transmitter.

Some embodiments include an encoding module for performing the operations of the transmitter and a decoding module for performing the operations of the receiver.

BRIEF DESCRIPTION OF DRAWINGS

The drawings illustrate selected embodiments of the disclosed subject matter. In the drawings, like reference labels denote like features.

DETAILED DESCRIPTION

Figure 1:
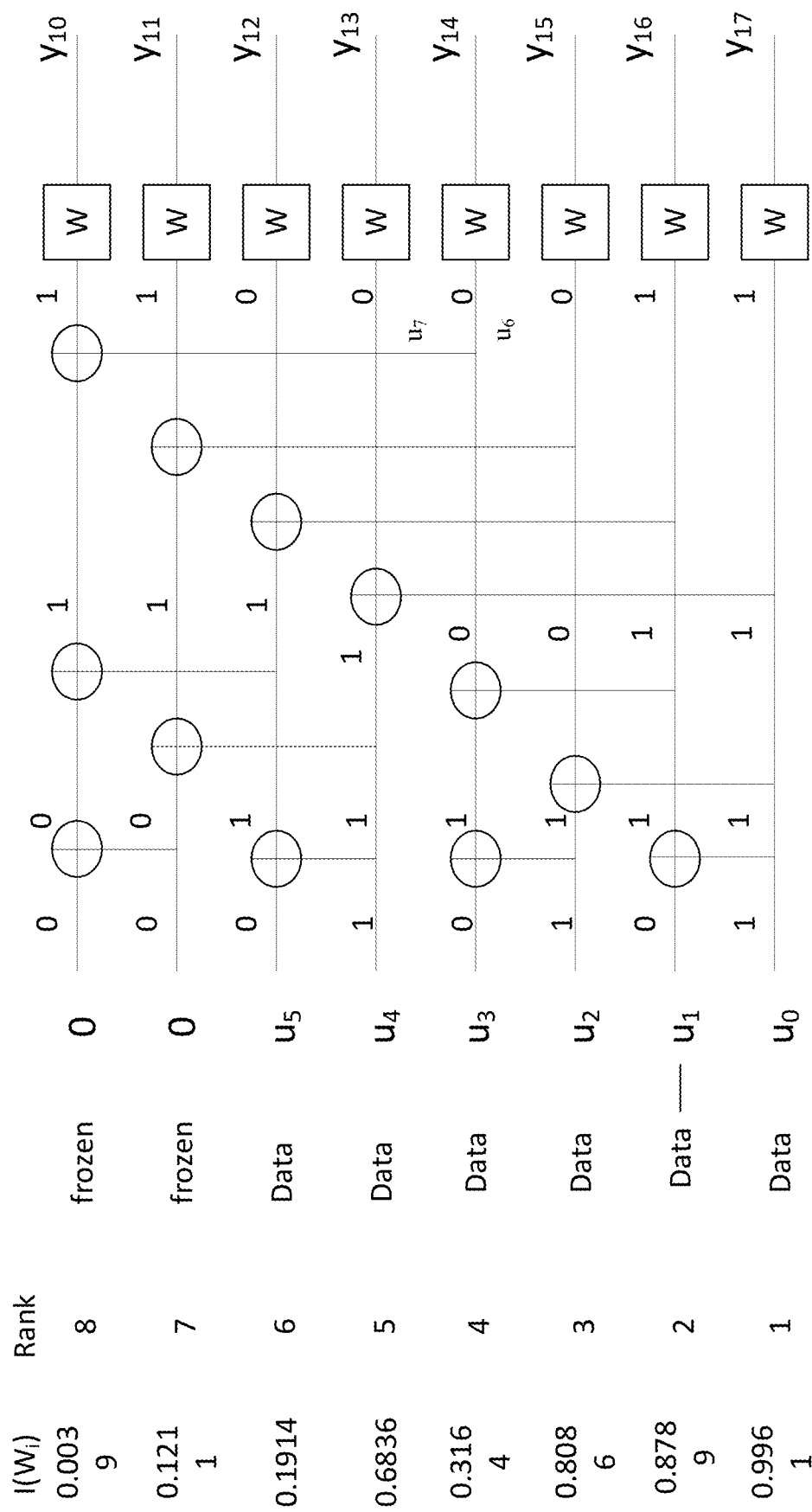
FIG. 1 shows an example of polar code structure with N=8.

Inventive concepts will now be described more fully hereinafter with reference to the accompanying drawings, in which examples of embodiments of inventive concepts are shown. Inventive concepts may, however, be embodied in many different forms and should not be construed as limited to the embodiments set forth herein. Rather, these embodiments are provided so that this disclosure will be thorough and complete, and will fully convey the scope of present inventive concepts to those skilled in the art. It should also be noted that these embodiments are not mutually exclusive. Components from one embodiment may be tacitly assumed to be present/used in another embodiment. Any two or more embodiments described below may be combined in any way with each other. Moreover, certain details of the described embodiments may be modified, omitted, or expanded upon without departing from the scope of the described subject matter.

The following description presents various embodiments of the disclosed subject matter. These embodiments are presented as teaching examples and are not to be construed as limiting the scope of the disclosed subject matter. For example, certain details of the described embodiments may be modified, omitted, or expanded upon without departing from the scope of the disclosed subject matter.

A central idea of certain embodiments is to concatenate an outer (possibly linear) block code before the encoder of an inner Polar code before each transmission. The outer code mixes the input bits so that the number of input information bits can be larger than the number of bits at the input of the Polar decoder, where the input to the Polar encoder is a function of the block of input information bits. A different outer "mixing" code is used at a different transmission in such a way that the rank of their aggregated generating matrix has full rank, deterministically or stochastically at high probabilities, so that all the input information bits are decodable at the receiver.

As used herein, a "radio node" is either a radio access node or a wireless device.

As used herein, a "radio access node" is any node in a radio access network of a cellular communications network that operates to wirelessly transmit and/or receive signals. Some examples of a radio access node include, but are not limited to, a base station (e.g., an enhanced or evolved Node B (eNB) in a Third Generation Partnership Project (3GPP) Long Term Evolution (LTE) network), a high-power or macro base station, a low-power base station (e.g., a micro base station, a pico base station, a home eNB, or the like), and a relay node.

As used herein, a "core network node" is any type of node in a Core Network (CN). Some examples of a core network node include, e.g., a Mobility Management Entity (MME), a Packet Data Network (PDN) Gateway (P-GW), a Service Capability Exposure Function (SCEF), or the like.

As used herein, a "wireless device" is any type of device that is capable of wirelessly transmitting and/or receiving signals to/from another wireless device or to/from a network node in a cellular communications network to obtain has access to (i.e., be served by) the cellular communications network. Some examples of a wireless device include, but are not limited to, a User Equipment device (UE) in a 3GPP network, a Machine Type Communication (MTC) device, an NB-IoT device, an FeMTC device, etc.

As used herein, a "network node" is any node that is used and can correspond to any type of radio network node or any network node, which communicates with a UE and/or with another network node. Examples of network nodes are NodeB, MeNB, SeNB, a network node belonging to MCG or SCG, base station (BS), multi-standard radio (MSR) radio node such as MSR BS, eNodeB, network controller, radio network controller (RNC), base station controller (BSC), relay, donor node controlling relay, base transceiver station (BTS), access point (AP), transmission points, transmission nodes, RRU, RRH, nodes in distributed antenna system (DAS), core network node (e.g. MSC, MME, etc.), O&M, OSS, SON, positioning node (e.g. E-SMLC), MDT, etc.

As used herein, the non-limiting term user equipment (UE) is used and it refers to any type of wireless device communicating with a network node and/or with another UE in a cellular or mobile communication system. Examples of UE are target device, device to device (D2D) UE, machine type UE or UE capable of machine to machine (M2M) communication, PDA, PAD, Tablet, mobile terminals, smart phone, laptop embedded equipped (LEE), laptop mounted equipment (LME), USB dongles, ProSe UE, V2V UE, V2X UE, etc.

As used herein, the non-limiting term WAN (wireless access network or RAN, radio access network) node can be a UE or a network node (e.g. access point, BS etc.) The WAN node may be interchangeably called as cellular node, NW source node etc.

Note that the description given herein focuses on a 3GPP cellular communications system and, as such, 3GPP LTE terminology or terminology similar to 3GPP LTE terminology is oftentimes used. However, the concepts disclosed herein are not limited to LTE or a 3GPP system. Moreover, in the description herein, reference may be made to the term "cell;" however, particularly with respect to Fifth Generation (5G) concepts, beams may be used instead of cells and, as such, it is important to note that the concepts described herein are equally applicable to both cells and beams.

Polar coding may generally involve transforming a pair of identical binary-input channels into two distinct channels of different qualities, one better and one worse than the original binary-input channel. By repeating the pair-wise polarizing operation on a set of $2^M$ independent uses of a binary-input channel, a set of $2^M$ "bit-channels" of varying qualities can be obtained. Some of these bit channels may be very high quality (i.e., error free), while the rest of them may be nearly useless (i.e., totally noisy). A goal may be to use the nearly perfect channel to transmit data to the receiver while setting the input to the useless channels to include fixed or frozen values (e.g., 0) that are known to the receiver. For this reason, those input bits to the nearly useless channel and the very high quality channel are commonly referred to as frozen bits and non-frozen (or information) bits, respectively. The non-frozen bits are used to carry data in a polar code.

Brief reference is now made to FIG. 1, which is a schematic diagram illustrating a structure of a length-8 polar code. As shown therein, an 8-bit input data vector u is defined having values $u_0$ to $u_7$. The input data vector u includes both frozen and non-frozen bits. The same physical channel is divided by the polarization operation into 8 bit-channels which are assigned channel indices (i) of 0 through 7. In this example, the bits at positions $u_6$, and $u_7$ (corresponding to channel indices 6 and 7) are frozen bits that have been assigned a value of 0, while the bits at positions $u_0$-$u_5$ (corresponding to channel indices 0-5) are non-frozen information bits.

The assignment of frozen or non-frozen bits to individual channels is based on the reliability of the channels. Each of the bit-channels has a reliability $I(W_i)$ that corresponds to the mutual information between the transmitted and received bit on the channel. That is, a low reliability indicates that the bit input to the bit-channel and the bit-output by the bit-channel are not highly correlated, while a high reliability indicates that the bit input to the bit-channel and the bit-output by the bit-channel are highly correlated. In this example, the channels having indices 6 and 7 have relatively low reliabilities, and therefore are assigned frozen bits, while the channels having indices 0 through 5 have relatively high reliabilities, and therefore are assigned information bits. In systems with a larger number of bit-channels, the differences between reliabilities of the bit-channels are typically more extreme than are shown in this example.

The frozen bits in a polar encoding/decoding system are fixed and known to both the transmitter and the receiver. In the example illustrated in FIG. 1, the frozen bits have the value of 0. The frozen bits may take other values, provided those values are known a priori to the receiver or can be calculated by the receiver. Some embodiments described below take advantage of this property to perform error detection.

As shown in FIG. 1, each bit location indexed by i is associated with a reliability of the corresponding bit-channel W1. The reliability values may be the mutual information $I(W_i)$ between this bit and the received signals, as shown on the left side FIG. 1, or they may be the precomputed block error probability of the bit channel. These reliability values can be pre-determined for both the frozen bit locations and information bit locations. A high reliability value corresponds to a lower bit error probability when the associated bit location is used to carry an information bit.

A polar code structure with N=8 may serve as the 1st transmission in HARQ with incremental redundancy.

Figure 2:
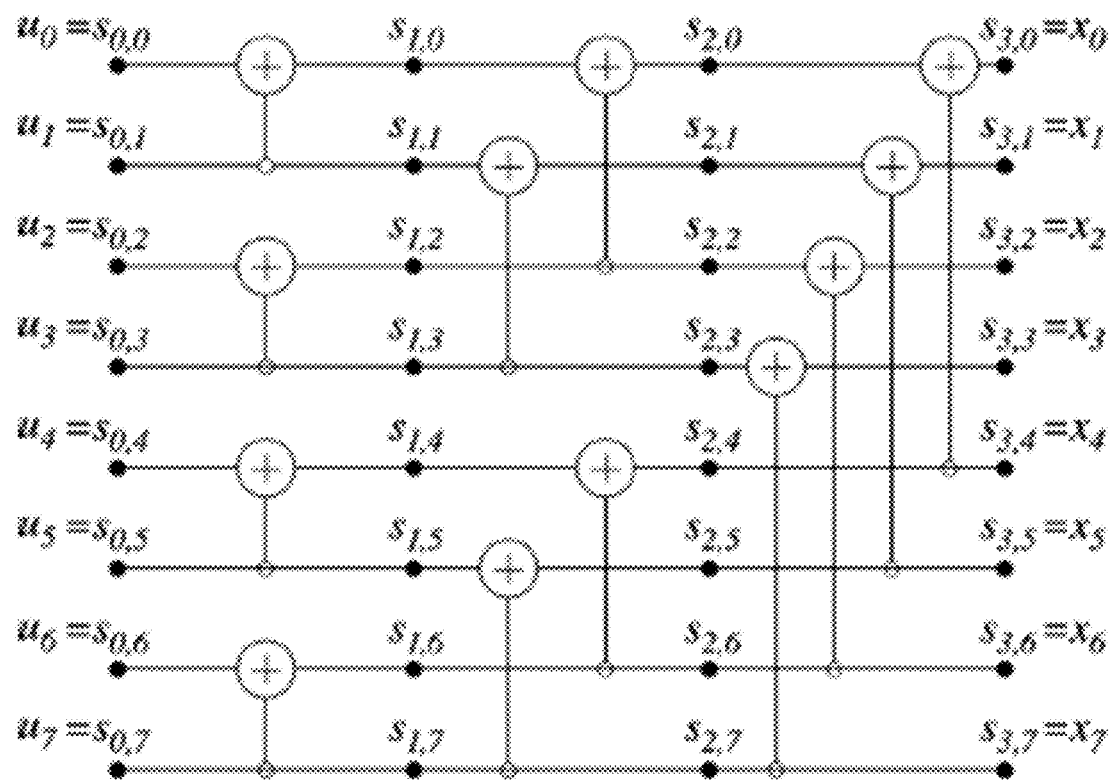
FIG. 2 shows an example of a polar code encoder with N=8.

Brief reference is now made to FIG. 2, which is a schematic diagram illustrating the labeling of intermediate information bits in a polar encoding. FIG. 2 illustrates the intermediate information bits $s_{l,i}$ that are generated at each stage of the encoding process where $l \in \{0,1, \ldots, n\}$ is the encoding stage or level and $i \in \{0,1, \ldots, N-1\}$ is the channel index for polar encoding with N=8. Referring to FIGS. 1 and 2, the input data vector u, which in the example of FIG. 1 has the value [1 0 1 0 1 0 0 0], is input to an encoder that encodes the data through a series of XOR operations into intermediate information bits $s_{l,i}$. At the output of the encoding process, a transmission data vector x (corresponding to the intermediate information bits $s_{3,i}$ in this example) is obtained for transmission over a channel W. In the example of FIG. 1, the transmission data vector x has the value [1 1 0 0 0 0 1 1]. Since the same physical channel is used for each bit, the channel properties of each channel W are assumed to be identical. A vector y of values received over the channel W corresponding to the transmission data vector x has values $y = [y_0\ y_1\ y_2\ y_3\ y_4\ y_5\ y_6\ y_7]$. The values $y_i$ of the received data vector y are used to calculate Log Likelihood Ratio (LLR) values that indicate probabilities that corresponding values of the transmission data vector x were transmitted. As will be appreciated, LLR values have both a magnitude and a sign, where the sign of the LLR value indicates the received symbol (e.g., a negative sign corresponds to a '1', while a positive sign corresponds to a '0') and the magnitude of the LLR value indicates the likelihood of such symbol being correct. Though the decoding process, the receiver generates estimates û of the input data vector u from the received values y.

As illustrated, intermediate information bits may be labeled as $s_{l,i}$, where $l \in \{0,1, \ldots, n\}$ and $i \in \{0,1, \ldots, N-1\}$ during polar encoding with N=8. The intermediate info bits may be related by the following equation:

$$s_{l+1,i} = s_{l,i} \oplus s_{l,i+2^l}, \text{ if } \mathrm{mod}\left(\left\lfloor \frac{i}{2^l} \right\rfloor, 2\right) = 0,$$

$$s_{l+1,i} = s_{l,i}, \text{ if } \mathrm{mod}\left(\left\lfloor \frac{i}{2^l} \right\rfloor, 2\right) = 1$$

for $i \in \{0,1, \ldots, N-1\}$ and $l \in \{0,1, \ldots, n-1\}$, with $s_{0,i} = u_i$ be the info bits,
and $s_{n,i} = x_i$ be the code bits, for $i \in \{0,1, \ldots, N-1\}$.

In some embodiments, the encoded data may be decoded using a butterfly based decoder. Brief reference is made to FIG. 3, which is a schematic diagram illustrating a butterfly based encoder for the case of N=8. Messages passed in the decoder may be Log Likelihood Ratio (LLR) values denoted as $L_{l,i}$, where l and i correspond to the graph stage index and row index, respectively. In addition, $L_{n,i}$ ma be the LLR directly calculated from the channel output $y_i$. The basic components of the decoder are two functions given by:

$$L_{l-1,i} = f(L_{l,i}, L_{l,i+2^l}) \triangleq 2\tanh^{-1}\left(\tanh(L_{l,i}/2)\tanh(L_{l,i+2^l}/2)\right) \text{ if } B(l, i) = 0$$

$$L_{l-1,i} = g(\hat{s}_{l,i-2^l}, L_{l,i}, L_{l,i-2^l}) \triangleq (-1)^{\hat{s}_{l,i-2^l}} L_{l,i-2^l} + L_{l,i} \text{ if } B(l, i) = 1;$$

for $l \in \{0,1, \ldots, n-1\}$ and $i \in \{0,1, \ldots, N-1\}$, where B(l, i) denotes the lth significant bit in the binary representation of i, and where $\hat{s}_{l,i}$ denotes an estimate of the intermediate info bit $s_{l,i}$.

Figure 3:
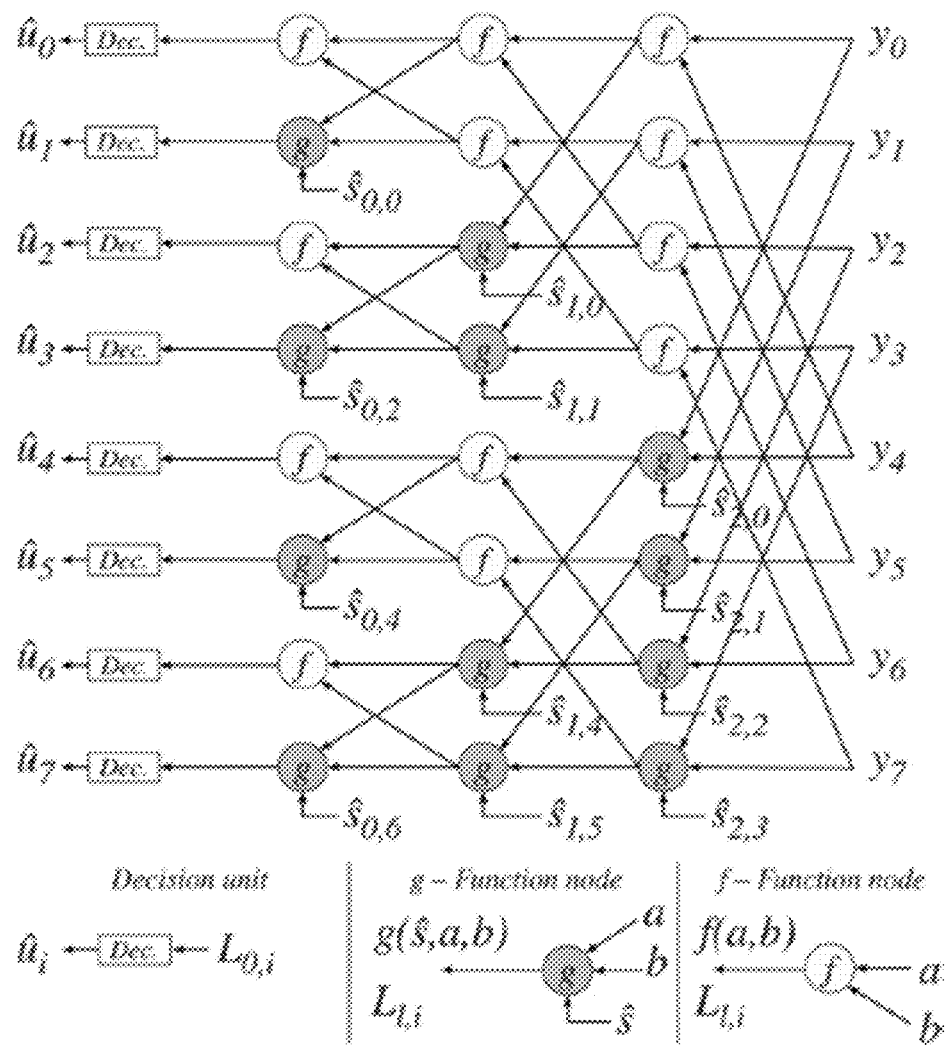
FIG. 3 shows an example of a butterfly-based SC decoder with N=8.

As can be seen in FIG. 3, the decoder uses the LLR values $L_{n,i}$ to calculate a soft decision value $L_{0,0}$ corresponding to bit index 0 using only the "f" function of equation [3] at function nodes 14-1 to 14-6. The soft decision value $L_{0,0}$ is processed by a decision block 12 to generate a bit estimate $\hat{u}_0$ for channel index 0. To generate the soft decision value $L_{0,1}$ which is used to generate a bit estimate $\hat{u}_1$ for channel index 1, the decoder uses both "f" functions and a "g" function at function node 14-7 that takes the intermediate information bit estimate $\hat{u}_{0,0}$ corresponding to the soft decision value $L_{0,0}$ as an input. Thus, the bit estimate $\hat{u}_1$ for channel index 1 is determined after the bit estimate $\hat{u}_0$ for channel index 0 is determined. Subsequent bit estimates are determined successively in a similar manner.

As each successive bit estimate is generated, the decoder generates two decoding paths corresponding to the two possible bit values, with each path having an associated probability of being correct. The decoder may keep a maximum of $L_{path}$ such paths in memory at any given time, keeping only the $L_{path}$ most likely decoding paths and discarding less likely decoding paths. When the decoder reaches the end of the data, the vector of estimates corresponding to the most likely decoding path is selected as the decoded data vector.

Wireless broadband systems may require flexible and adaptive transmission techniques since they may operate in the presence of time-varying channels. For such systems, hybrid automatic repeat request (HARQ) based on incremental redundancy (HARQ-IR) schemes are often used, where parity bits are sent in an incremental fashion depending on the quality of the time-varying channel. IR systems require the use of rate-compatible punctured codes. According to the rate requirement at the instance of data scheduling, an appropriate number of coded bits may be determined by the scheduler. The coded bits are generated by the encoder and sent by the transmitter during the first transmission and/or subsequent retransmissions. Here, the set of coded bits of a higher rate code should be a subset of the set of coded bits of a lower rate code. In a HARQ-IR system, therefore, if the receiver fails to decode at a particular rate, it only needs to request additional coded bits to be transmitted in subsequent re-transmissions by the transmitter.

Previously, a new class of rate compatible polar codes has been introduced to allow HARQ-IR retransmissions. For HARQ schemes that adopt this class of codes, each (re-) transmission uses a separate polar code (with its own associated polar encoder) to generate a separate code block. A portion of non-frozen bits used in each of the previous transmissions may be aggregated, re-encoded and transmitted in a subsequent re-transmission. The amount of non-frozen bits taken from each previous transmission to form the new re-transmission is determined in such a way that each of the previous (re-)transmissions would result in the same effective (lowered) coding rate if all subsequent transmissions are decoded successfully, and the decoded bits are used as frozen bits. This scheme of sending incremental redundant information over multiple transmissions may be referred to as the incremental freezing.

Figure 4:
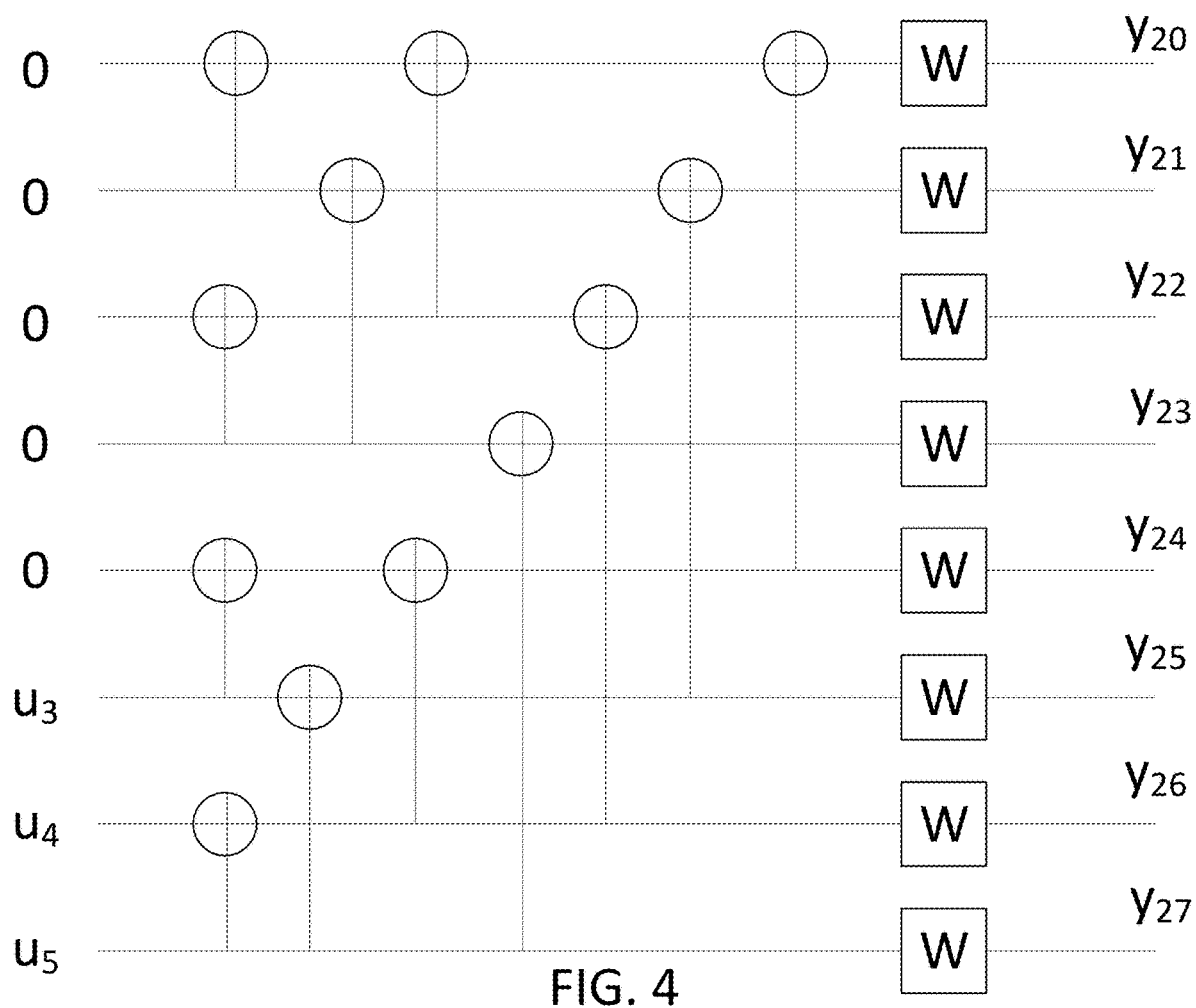
FIG. 4 is a schematic diagram illustrating an example of a polar code structure in a 2nd transmission in HARQ incremental redundancy according to embodiments herein.

The incremental freezing scheme is illustrated in an example with 3 transmissions, such as illustrated in FIGS. 1-3. In the first transmission, as illustrated in FIG. 1, 6 out of 8 bit channels of a length-8 polar code are loaded with data while the rest are frozen, giving an overall code rate of ¾. If the receiver fails to decode the 6 information bits, another length-8 polar code may be used to re-transmit the 3 least reliable bits ($u_3$, $u_4$, $u_5$), as illustrated in FIG. 4. The code rate in the 2nd code block is 3/8. The effective code rate of the 1st code block is also reduced from ¾ to ⅜ if the bits ($u_3$, $u_4$, $u_5$) are successively decoded from the 2nd code block and used as frozen bits to decode the first code block. If the receiver fails again to decode the 2nd transmission (i.e., first retransmission), the least reliable bit $u_3$ of the 2nd transmission and the least reliable bit $u_2$ of the 1st retransmission (assuming not all data bits in the 2nd transmission has been successively decoded) are retransmitted using another length-8 polar codes. In this case, the effective code rates of all 3 code blocks are all reduced to from ⅜ to ¼ assuming that all data bits in subsequent retransmissions are successively decoded and used as frozen bits in corresponding previous transmission.

Figure 5:
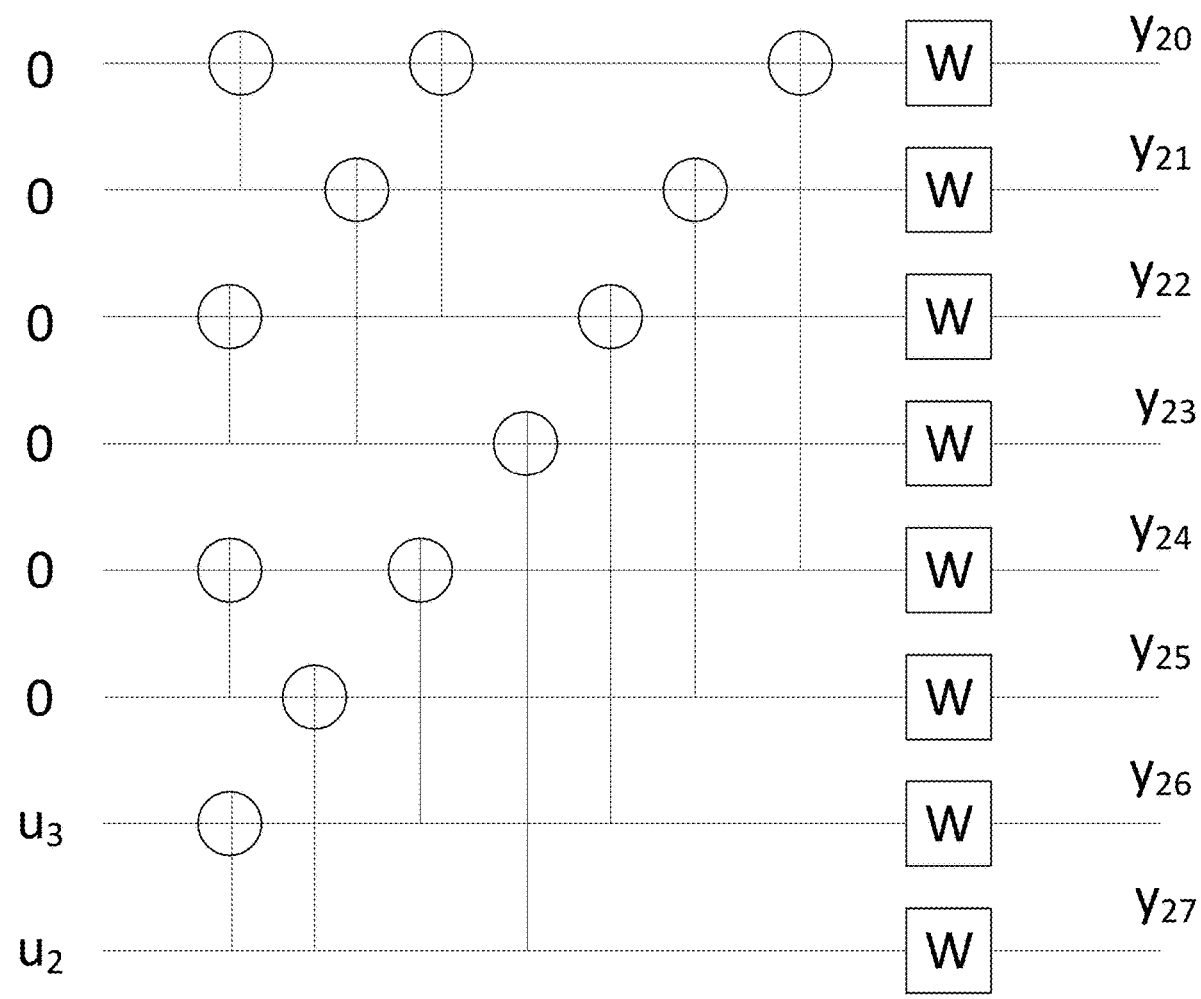
FIG. 5 is a schematic diagram illustrating an example of a polar code structure in a 3rd transmission (i.e., 2nd retransmission) in HARQ incremental redundancy according to embodiments herein.

Brief reference is made to FIGS. 4 and 5, which are schematic diagrams illustrating an example of polar code structure in a 2nd transmission (i.e., 1st retransmission) in HARQ incremental redundancy and polar code structure in a 3rd transmission (i.e., 2nd retransmission) in HARQ incremental redundancy, respectively. Referring to FIG. 4, the bits ($u_3$, $u_4$, $u_5$) transmitted using the least reliable channels in the first transmission may be retransmitted using channels having higher reliability relative to the other channels.

Other methods of successively decoding over multiple transmissions may provide that the decoder first decodes the most recent code block in the last re-transmission and then uses the decoded (hard) bits as frozen bits to decode the previous (re-)transmission until the first transmission is decoded. It can be shown that this simple decoding methods may achieve the aggregated capacity of all retransmissions.

While the reliability of the channels $I(W_i)$ may be useful to identify channel performance estimations prior to transmissions, unpredictable channel failure, such as channel fading, may be unrelated to the reliability estimates and thus unpredictable.

The idea of certain embodiments is to concatenate an outer (possibly linear) block code before the encoder of an inner Polar code before each transmission. The outer code mixes the input information bits so that the number of input information bits that affect the input to the Polar encoder can be larger than the number of bits at the input of the Polar decoder. A different outer "mixing" code is used at different transmissions. These outer "mixing" codes may be chosen in such a way that the rank of their aggregated generating matrix has full rank, deterministically or stochastically at high probabilities, so that the input information bits may be decodable at the receiver.

Certain embodiments may provide one or more potential benefits compared to conventional approaches, such as the following examples. Certain proposed methods and/or apparatuses may ensure that each information bit may be coded across multiple transmissions to provide robustness, for example, against fading channels. In general, diversity may be effectively utilized across the multiple transmissions of an information block. Certain proposed methods and/or apparatuses may also improve the rate of reduction in the block-error-rate as the signal-to-noise-rate increases (i.e. steeper block error rate curves) by attaining an increase in the minimum distance of concatenated code used in every transmission.

Certain embodiments may also avoid various shortcomings associated with conventional approaches. For example, incremental freezing has the problem that (re)transmissions are independent polar codes and do not share information effectively between the (re-) transmissions. In particular, some information bits may only be coded and transmitted over a single transmission. This may result in a lack of diversity in protecting these information bits in fading environments regardless how low the overall coding rate may be. For example, referring to the examples illustrated in FIGS. 1-3, the information bits, $u_0$ and $u_1$, are only transmitted over the first transmission. Therefore, if the quality of the channel that the first transmission goes through is bad (e.g., faded down), there is no way for the decoder to recover these two information bits, thus causing a frame/block error, even though the overall coding rate after 3 transmissions may be quite low. As a result, such a scheme may suffer a degradation in performance.

Figure 6:
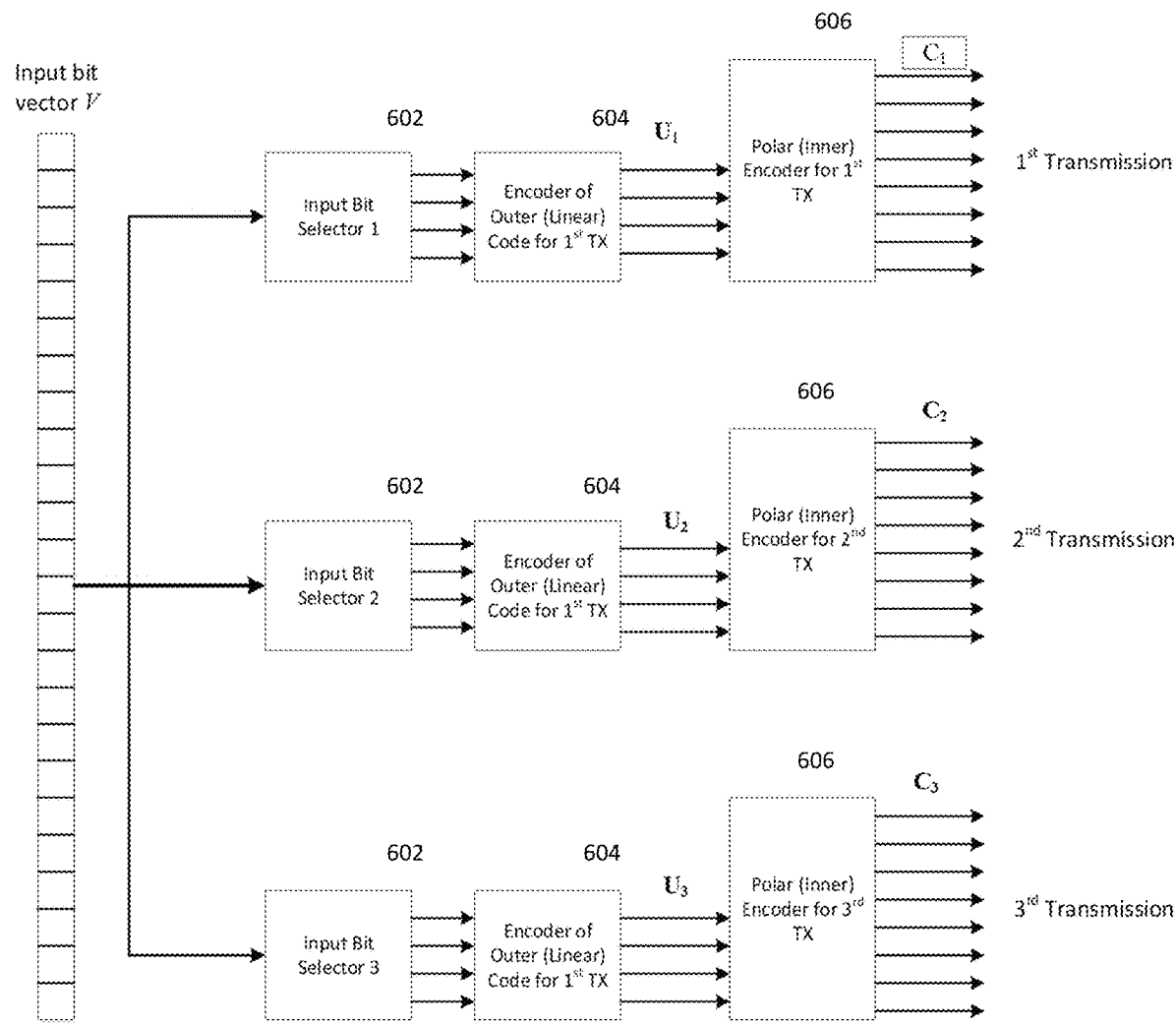
FIG. 6 is a block diagram illustrating an embodiment with an example of 3 transmissions.

Reference is now made to FIG. 6, which is a block diagram illustrating an embodiment with an example of 3 transmissions. At each transmission, a certain subset (or all) of the input information bits from the vector V is chosen by an input bit selector 602 and is fed into the encoder of an outer code 604, whose output is a mixture of the information bits in V. The output $U_j$ of the encoder of the outer code 604 is then fed into a Polar encoder 606, for j=1,2,3. The output of each Polar encoder 606 is then modulated and transmitted for the corresponding transmission. The input bit selector 602 and encoder of the outer code 604 for each transmission shown may be chosen such that the rank of the aggregated generating matrix of the outer codes for all previous (re-) transmissions is full, at least with high probability. This may provide that a sufficient amount of information is provided for the decoder at the receiver to recover the input information bits.

According to some embodiments, the generating matrices of these outer "mixing" codes may be obtained pseudo-randomly according to a random number generator whose seed is known at both the encoder and the decoder. In such cases, the aggregated generating matrix may have full rank after every (re-)transmission with high probability. According to some embodiments, these outer mixing codes may be pre-determined to ensure that the aggregated generating matrix will have full rank after every transmission and that every input information bit is mixed into two or more transmissions to provide diversity for that information bit.

Some embodiments may include a serially concatenated block code and Polar code for each transmission. For example, a linear block code may be used as an outer code and a Polar code may be used as an inner code in every (re-)transmission. This may form a serially concatenated encoding scheme for every transmission and/or retransmission.

For the linear block outer code, every output symbol is generated as an exclusive OR (XOR) of some or all of the input symbols. Some embodiments provide that a Tanner graph describes the relationship between input and output symbols. The decoding procedure is based on the Belief-Propagation (BP) and/or other appropriate algorithms. Similar to LDPC codes, at each decoding iteration of the outer code, the BP algorithm may exchange messages between check nodes and variable nodes of the outer code, in order to produce an estimated information vector.

The transmitter and the receiver may share mutual information about the outer code definition at each (re-)transmission. The decoder of the outer code knows from which input bits each output symbol was produced. For example, the decoder may have information corresponding to the Tanner graph of the outer code. In some embodiments, the output symbol may be built in a pseudo-random manner based on a random number generator and the indices of input bits may be chosen pseudo-randomly in a similar manner. This may be achieved if the encoder and the decoder are synchronized and share a common random number generator. In some embodiments, the specific mapping between input bits and output symbol are deterministic and pre-determined for each transmission.

Certain embodiments may be illustrated with the following example of 3 (re)transmissions. However, methods, devices and systems described herein may be extended to more or less that three (re)transmissions. Embodiments will be described first corresponding to the transmitter and second to the receiver.

Figure 7:
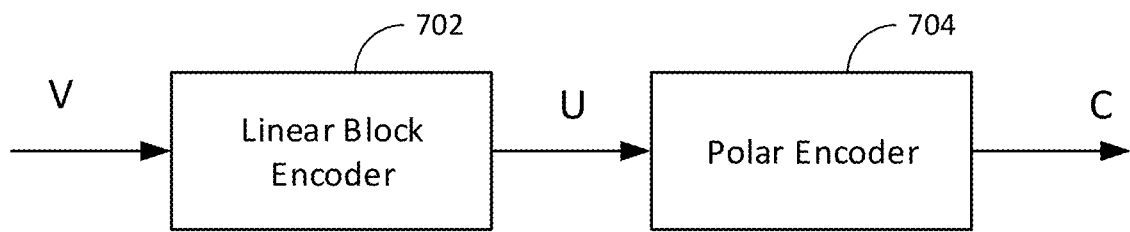
FIGS. 7 and 8 are block schematic diagrams illustrating structures and data corresponding to a transmitter and a receiver, respectively, as described herein.
Figure 8:
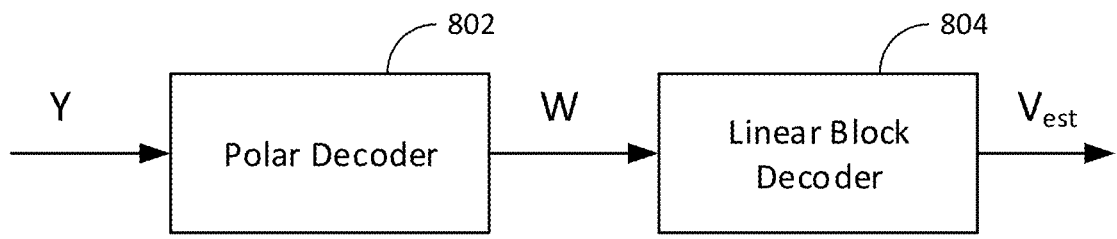

Brief reference is now made to FIGS. 7 and 8, which are block schematic diagrams illustrating structures and data corresponding to a transmitter and a receiver, respectively, as described herein. Regarding the transmitter, in the 1st transmission, preferably, the entire set of info bit block V is encoded by the linear block encoder 702. In some embodiments, a subset of the info bit block V is encoded by the linear block outer code with generating matrix $G_1$.

In the T-th transmission, T>1, another subset of the info bit block V is selected and encoded by another outer code with generating matrix $G_T$.

According to some embodiments, the selection of bits to encode and the input-output mapping of the linear block encoder 702 can be obtained based on a random number generator that is known to both the linear block encoder 702 and the linear block decoder 804 at the receiver. According to some embodiments, the selection of input bits and the mapping from input bits to output bits may be pre-determined and known to both the linear block encoder 702 at the transmitter and the linear block decoder 804 at the receiver. For example, the input and output bits may be predetermined such that the aggregated generating matrix $\overline{G}_T$ defined as:

$$\overline{G}_T = \begin{bmatrix} G_1 \\ G_2 \\ \vdots \\ G_T \end{bmatrix}$$

such that $\overline{G}_T$ has full rank for each T>1. Some embodiments provide that when $\{G_i\}$ are randomly generated according to a random number generator, the aggregated generating matrix $\overline{G}_T$ has a high probability of having a full rank.

Regarding the receiver, in the 1st transmission, the receiver first decodes using the Polar decoder 802. The Polar decoder 802 outputs soft LLR value, $LLR_{U1}$, for each bit of vector $U_1$. $LLR_{U1}$ is then used as the input of the linear block decoder 804, e.g., BP decoder. In the T-th transmission, T>1, the receiver decodes the subset $U_{tx,T}$ using the Polar decoder 802, and generates soft LLR output, $LLL_{UT}$, for $U_T$. The soft LLR values, $[LLR_{U1}, LLR_{U2}, \ldots, LLR_{UT}]$ are concatenated and used in decoding of the outer code by the linear block decoder 804. The aggregated linear block code used in decoding T-th transmission is the combined linear codes of 1st, 2nd, ..., and T-th transmission with generating matrix $\overline{G}_T$.

Figure 9:
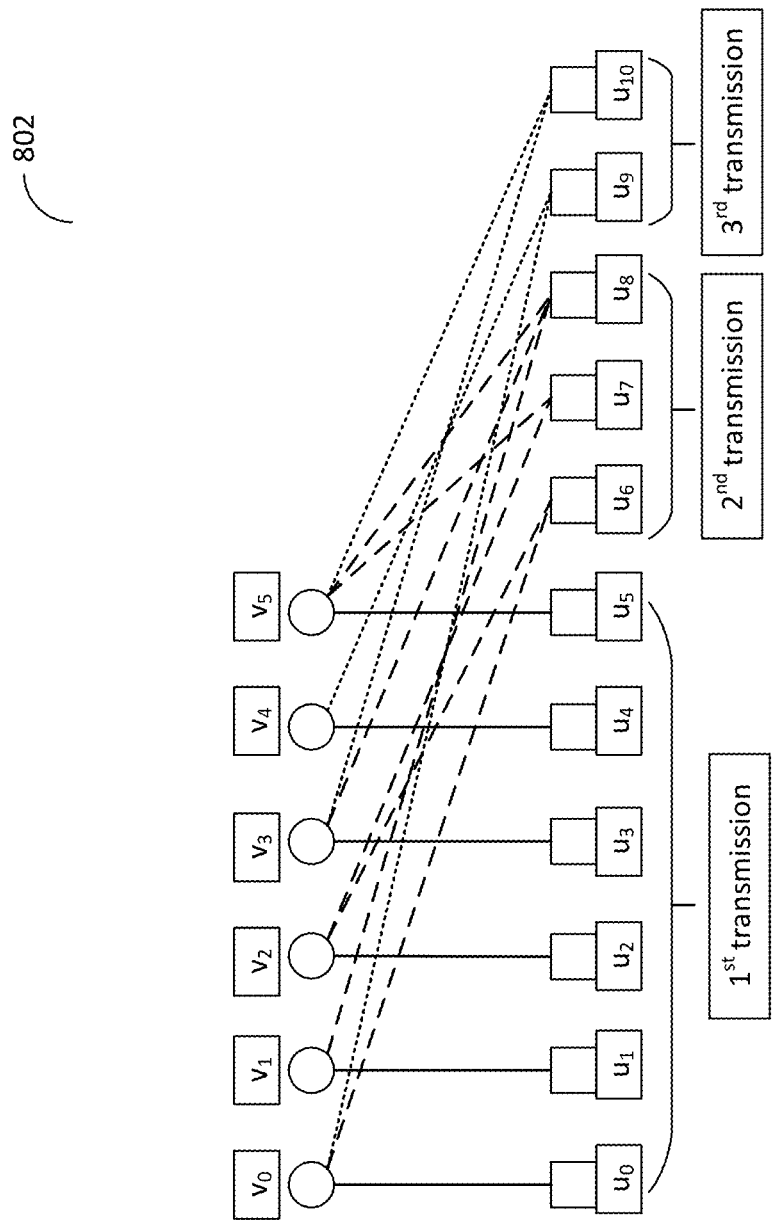
FIG. 9 is a schematic diagram illustrating the outer code of three transmissions for a given information vector V.

Reference is now made to FIG. 9, which is a schematic diagram illustrating the outer code of three transmissions for a given information vector V. In the first transmission, the length-J binary information vector V is encoded into length-$K_1$ binary vector $U_1$, where J=6, V=$[v_0\ v_1\ v_2\ v_3\ v_4\ v_5]^T$. In general, $u_i$ is a binary XOR of selected set of $v_k$, where $0 \le k \le K_1-1$, $0 \le j \le J-1$.

In general, vector $U_1$ is generated from vector V by:

$$U_1 = G_1 \times V$$

For example, in FIG. 3, this may be expressed as:

$$\begin{bmatrix} u_0 \\ u_1 \\ u_2 \\ u_3 \\ u_4 \\ u_5 \end{bmatrix} = \begin{bmatrix} 1 & \cdots & 0 \\ \vdots & \ddots & \vdots \\ 0 & \cdots & 1 \end{bmatrix} \begin{bmatrix} v_0 \\ v_1 \\ v_2 \\ v_3 \\ v_4 \\ v_5 \end{bmatrix}$$

In FIG. 3, the special case of $K_1$=J, $u_i$=$v_i$ is illustrated. Here the generator matrix $G_1$ is an identity matrix, but in general it can be any $K_1$ by $K_1$ matrix. Vector $U_1$ is used as input to the inner code, polar code, to generate the final codeword $C_1$ to transmit over the channel during the 1st transmission.

At the receiver, according to some embodiments, the channel signal $Y_1$ is received and fed into the inner decoder, which is a Polar decoder. The soft output $W_1$ of the inner decoder is then fed into the outer decoder, which is the linear block decoder. The linear block decoder produces the estimated information vector V, $V_{est,1}$, using the soft output $W_1$. In the first transmission, the linear block decoder operates on the linear code defined by generator matrix $G_1$. According to another embodiment, a joint decoder is used to take the channel signal $Y_1$ and directly generates the estimated information vector $V_{est,1}$ while taking into account the outer code defined by generator matrix $G_1$.

If the first transmission is not successful in a HARQ procedure, then the 2nd transmission is carried out. In the second transmission of information vector V, a length-$K_2$ vector $U_2=[u_6, u_7, u_8]$ is generated by:

$$U_2 = G_2 \times V$$

For the example in FIG. 3, this can be written as:

$$\begin{bmatrix} u_6 \\ u_7 \\ u_8 \end{bmatrix} = \begin{bmatrix} 1 & 0 & 1 & 0 & 0 & 0 \\ 0 & 0 & 1 & 0 & 0 & 1 \\ 0 & 1 & 0 & 1 & 0 & 1 \end{bmatrix} \begin{bmatrix} v_0 \\ v_1 \\ v_2 \\ v_3 \\ v_4 \\ v_5 \end{bmatrix}$$

Vector $U_2$ is used as input to the polar encoder 704, to generate the final codeword $C_2$ to transmit over the channel during the 2nd transmission. The mapping of the second transmission in this example provides that $u_6$ includes information from $v_0$ and $v_1$, $u_7$ includes information from $v_2$ and $v_5$ and $u_8$ includes information from $v_1$, $v_3$ and $v_5$.

At the receiver, according to one embodiment, the channel signal $Y_2$ is received and fed into the polar decoder 802. The soft output $W_2$ of the polar decoder 802, together with the soft output $W_1$ from the 1st transmission, is then fed into the linear block decoder 804. The linear block decoder 804 produces the estimated information vector V, $V_{est,2}$, using the soft output $[W_1\ W_2]$. In the second transmission, the linear block decoder 804 operates on the linear code defined by the composite generator matrix $\overline{G}_2=[G_1; G_2]$. According to some embodiments, a joint decoder may be used to take the received signals, $[Y_1, Y_2]$ and directly generate the estimated information vector $V_{est,2}$ while taking into account the outer code defined by generator matrices $[G_1, G_2]$.

If the second transmission is not successful in a HARQ procedure, then the 3rd transmission may be carried out. In the third transmission of information vector V, a length-$K_3$ vector $U_3=[u_9, u_{10}]$ is generated by:

$$U_3 = G_3 \times V$$

For the example in FIG. 3, this can be written as:

$$\begin{bmatrix} u_9 \\ u_{10} \end{bmatrix} = \begin{bmatrix} 1 & 0 & 0 & 0 & 1 & 0 \\ 0 & 0 & 0 & 1 & 0 & 1 \end{bmatrix} \begin{bmatrix} v_0 \\ v_1 \\ v_2 \\ v_3 \\ v_4 \\ v_5 \end{bmatrix}$$

Combining the first, second, and the third transmission, the outer encoding can be rewritten as:

$$\begin{bmatrix} U_1 \\ U_2 \\ U_3 \end{bmatrix} = \begin{bmatrix} G_1 \\ G_2 \\ G_3 \end{bmatrix} \times V$$

Vector $U_3$ is used as input to the polar encoder 704, to generate the final codeword $C_3$ to transmit over the channel during the 3rd transmission. The mapping of the third transmission in this example provides that $u_9$ includes information from $v_0$ and $v_4$ and $u_{10}$ includes information from $v_3$ and $v_5$.

At the receiver, according to some embodiments, the channel signal $Y_3$ is received and fed into the polar decoder 802. The soft output $W_3$ of the polar decoder 802, together with the soft output $W_1$ from the 1st transmission, is then fed into the linear block decoder 804. The linear block decoder 804 produces the estimated information vector V, $V_{est,3}$, using the soft output $[W_1\ W_2\ W_3]$. In the third transmission, the linear block decoder 804 operates on the linear code defined by the composite generator matrix $\overline{G}_3=[G_1; G_2; G_3]$. According to another embodiment, a joint decoder is used to take the received signals, $[Y_1, Y_2, Y_3]$ and directly generates the estimated information vector $V_{est,2}$ while taking into account the outer code defined by generator matrices $[G_1, G_2, G_3]$.

Although the example provided above includes three transmissions, more or less than three transmissions can be performed in accordance with embodiments herein. Further, although the example provided above includes that the outer coding uses the generator matrices $\{G_1, G_2, G_3, \ldots\}$, the same linear code may be described by corresponding parity-check matrices, $\{H_1, H_2, H_3, \ldots\}$. Yet further, although the inner code as described above includes a polar code, a variety of other codes can be used as inner code. Such inner codes should support soft decision decoding of the outer code and may be is capable of producing soft LLR bits for vector W.

While the above code design is described from the perspective of applying it to incremental redundancy (IR) HARQ, its variation can be readily adapted to data transmission where multiple blocks of coded bits are generated for a given block of information bits, and the multiple blocks of coded bits are transmitted without the need of receiving retransmission request from the receiver. One example of this is the system information block (SIB) transmission.

In LTE, SIB transmission may be performed in several blocks of coded bits and each block may be associated with a different random variable.

When applying the concatenated code to SIB transmission, the first block of coded bits is generated in the same way as the coded bits of the first transmission of IR-HARQ, the second block of coded bits is generated in the same way as the coded bits of the second transmission of IR-HARQ, etc. The first and the second block of coded bits may or may not have the same size.

The receiver may operate in a similar manner as the IR-HARQ receiver described herein.

In NB-IoT, uplink and downlink unicast data transmission may use the concepts described herein to generate several blocks of coded bits for a given transport block. This provides more performance gain by simply repeating the same set of coded bits numerous times. Note that repetition is widely used in DL and UL data transmission of MTC type of service to combat the degraded link quality that an MTC UE often experiences.

When applying the concatenated code to IR-repeated data transmission, the first block of coded bits is generated in the same way as the coded bits of the first transmission of IR-HARQ, the second block of coded bits is generated in the same way as the coded bits of the second transmission of IR-HARQ, etc. The first and the second block of coded bits typically have the same size.

The receiver operates similarly as the IR-HARQ receiver as well.

Embodiments of the disclosed subject matter, such as any of the above-described methods and/or apparatuses configured to perform such methods, may be implemented in any appropriate type of communication system supporting any suitable communication standards and using any suitable components. As one example, certain embodiments may be implemented in a communication system such as that illustrated in FIG. 10. Although certain embodiments are described with respect to LTE systems and related terminology, the disclosed concepts are not limited to LTE or a 3GPP system. Additionally, although reference may be made to the term "cell", the described concepts may also apply in other contexts, such as beams used in Fifth Generation (5G) systems, for instance.

Figure 10:
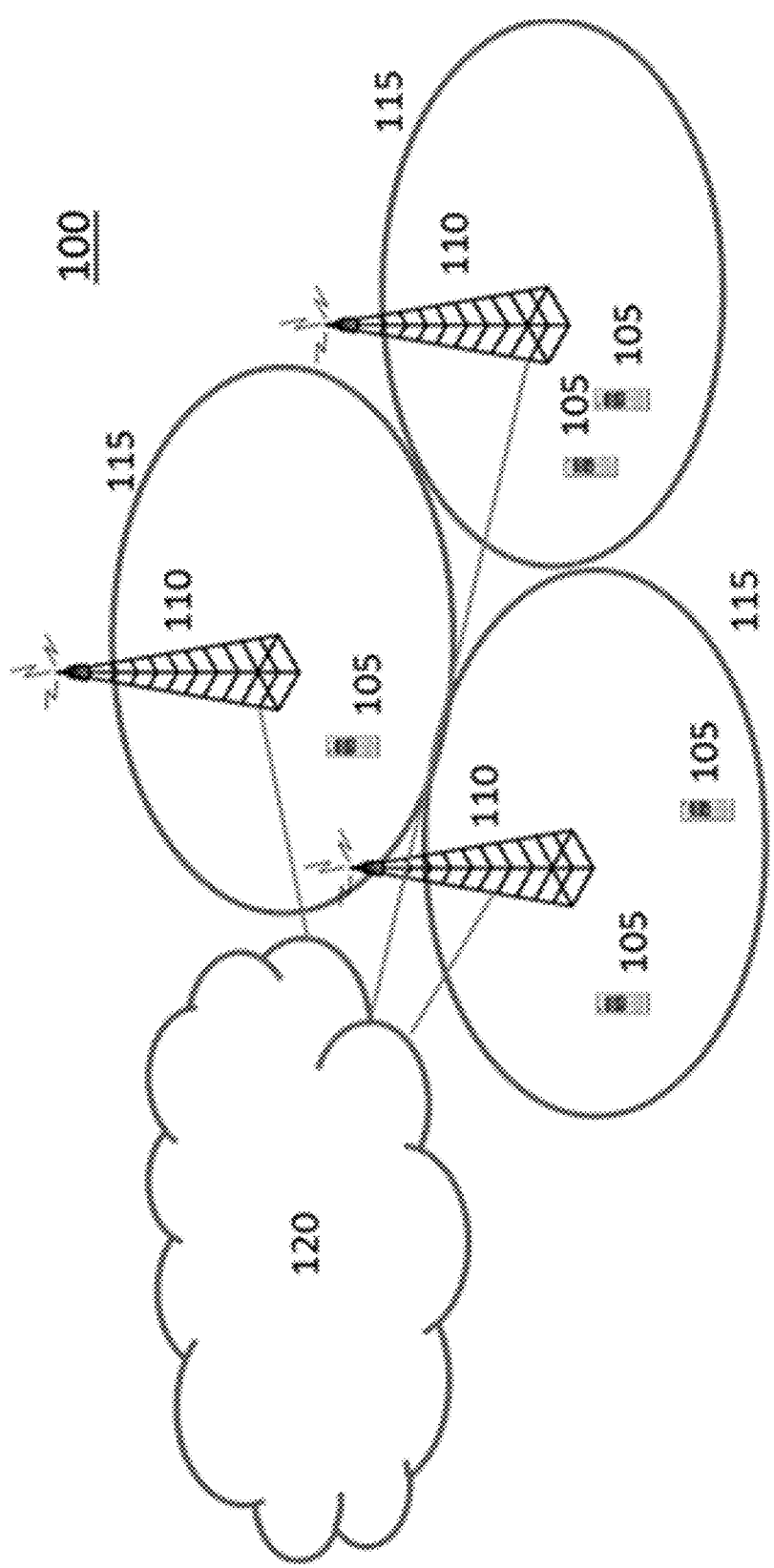
FIG. 10 is a schematic block diagram that illustrates a communication system according to some embodiments of the disclosed subject matter.

Reference is now made to FIG. 10, which is a schematic block diagram that illustrates a communication system according to some embodiments of the disclosed subject matter. A communication system 100 includes a plurality of wireless communication devices 105 (e.g., UEs, machine type communication [MTC]/machine-to-machine [M2M] UEs) and a plurality of radio access nodes 110 (e.g., eNodeBs or other base stations). Communication system 100 may be organized into cells 115, which are connected to a core network 120 via corresponding radio access nodes 110. Radio access nodes 110 are capable of communicating with wireless communication devices 105 along with any additional elements suitable to support communication between wireless communication devices or between a wireless communication device and another communication device (such as a landline telephone).

Figure 11B:
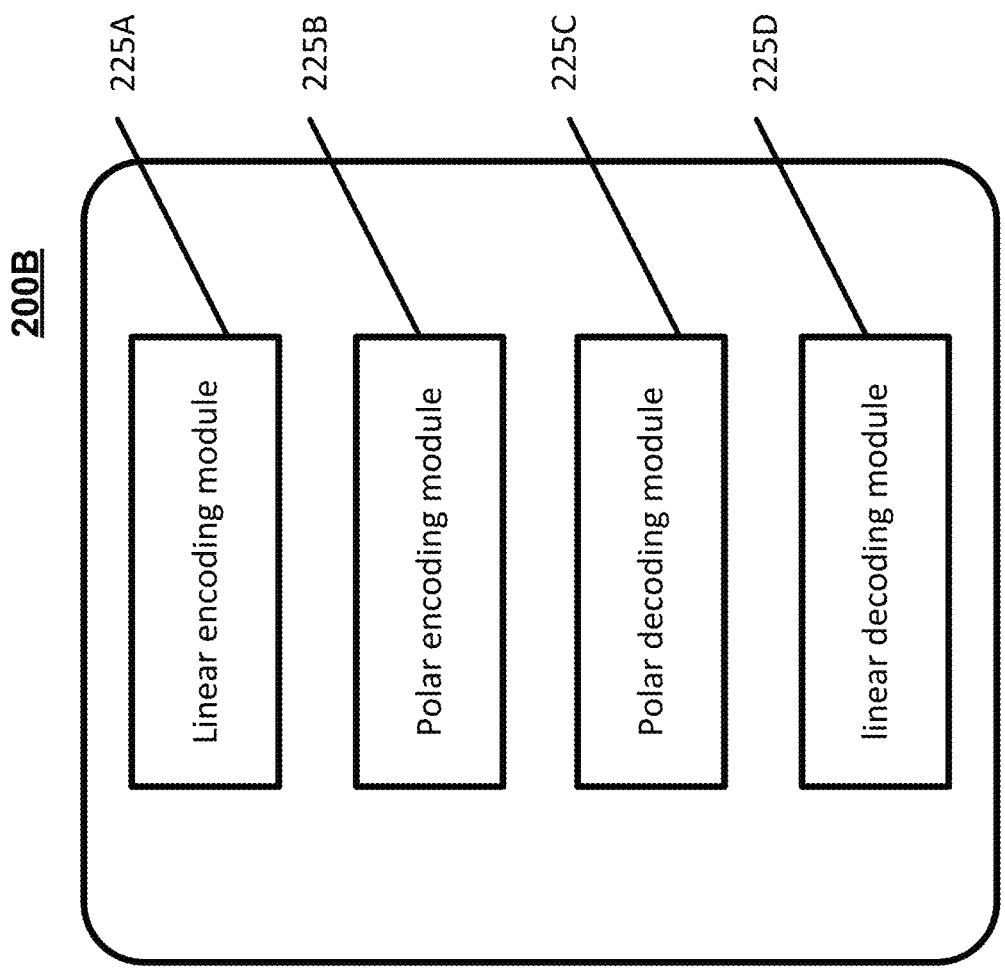
FIG. 11B is a block schematic diagram that illustrates a wireless communication device according to some embodiments of the disclosed subject matter.
Figure 11A:
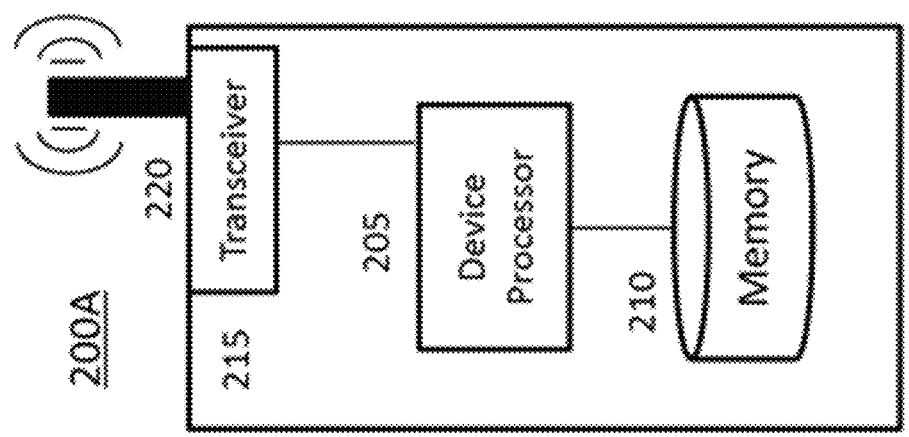
FIG. 11A is a schematic block diagram that illustrates a wireless communication device according to some embodiments of the disclosed subject matter.

Although wireless communication devices 105 may represent communication devices that include any suitable combination of hardware and/or software, these wireless communication devices may, in certain embodiments, represent devices such as those illustrated in greater detail in FIGS. 11A and 11B. Similarly, although the illustrated radio access node may represent network nodes that include any suitable combination of hardware and/or software, these nodes may, in particular embodiments, represent devices such those illustrated in greater detail by FIGS. 12A, 12B and 13.

Reference is now made to FIG. 11A, which is a schematic block diagram that illustrates a wireless communication device according to some embodiments of the disclosed subject matter. A wireless communication device 200A comprises a processor 205 (e.g., Central Processing Units [CPUs], Application Specific Integrated Circuits [ASICs], Field Programmable Gate Arrays [FPGAs], and/or the like), a memory 210, a transceiver 215, and an antenna 220. In certain embodiments, some or all of the functionality described as being provided by UEs, MTC or M2M devices, and/or any other types of wireless communication devices may be provided by the device processor executing instructions stored on a computer-readable medium, such as memory 210. Some embodiments may include additional components beyond those shown in FIG. 11A that may be responsible for providing certain aspects of the device's functionality, including any of the functionality described herein.

Reference is now made to FIG. 11B, which is a block schematic diagram that illustrates a wireless communication device according to another embodiment of the disclosed subject matter. A wireless communication device 200B comprises at least one module 225 configured to perform one or more corresponding functions. For example, methods herein may be performed using one or more of a linear encoding module 225A, a polar encoding module 225B, a polar decoding module 225C and a linear decoding module 225D. Examples of such functions include various method steps or combinations of method steps as described herein with reference to wireless communication device(s). In general, a module may comprise any suitable combination of software and/or hardware configured to perform the corresponding function. For instance, in some embodiments a module comprises software configured to perform a corresponding function when executed on an associated platform, such as that illustrated in FIG. 11A.

Figure 12B:
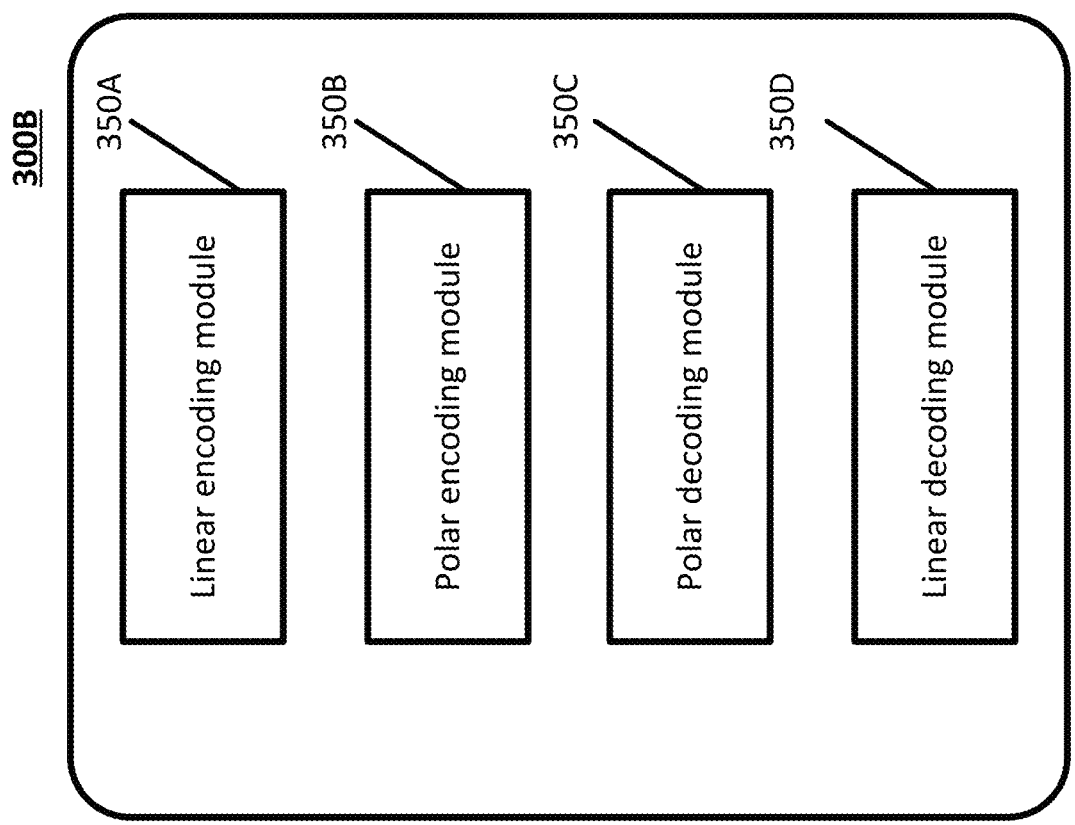
FIG. 12B is a block schematic diagram that illustrates a radio access node according to some embodiments of the disclosed subject matter.
Figure 12A:
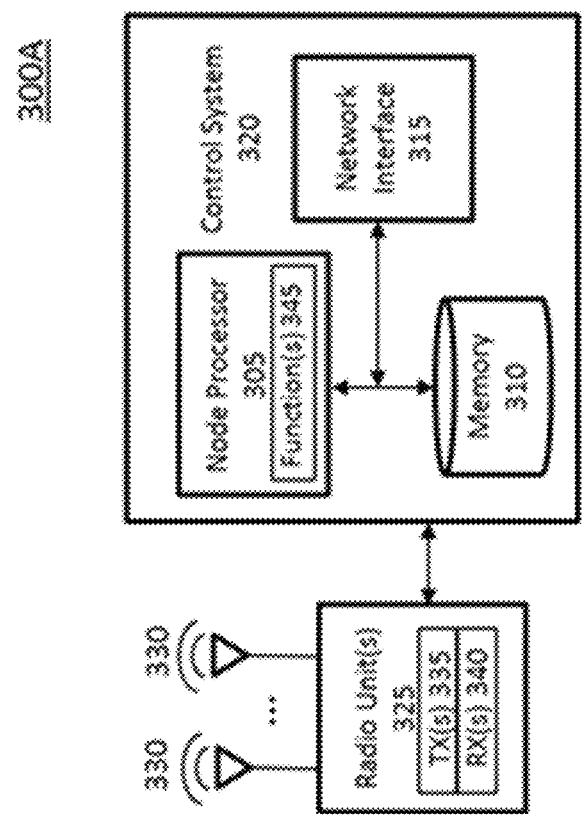
FIG. 12A is a block schematic diagram that illustrates a radio access node according to some embodiments of the disclosed subject matter.

Reference is now made to FIG. 12A, which is a block schematic diagram that illustrates a radio access node according to an embodiment of the disclosed subject matter. A radio access node 300A comprises a control system 320 that comprises a node processor 305 (e.g., Central Processing Units (CPUs), Application Specific Integrated Circuits (ASICs), Field Programmable Gate Arrays (FPGAs), and/or the like), memory 310, and a network interface 315. In addition, radio access node 300A comprises at least one radio unit 325 comprising at least one transmitter 335 and at least one receiver coupled to at least one antenna 330. In some embodiments, radio unit 325 is external to control system 320 and connected to control system 320 via, e.g., a wired connection (e.g., an optical cable). However, in some other embodiments, radio unit 325 and potentially the antenna 330 are integrated together with control system 320. Node processor 305 operates to provide at least one function 345 of radio access node 300A as described herein. In some embodiments, the function(s) are implemented in software that is stored, e.g., in the memory 310 and executed by node processor 305.

In certain embodiments, some or all of the functionality described as being provided by a base station, a node B, an enodeB, and/or any other type of network node may be provided by node processor 305 executing instructions stored on a computer-readable medium, such as memory 310 shown in FIG. 12A. Some embodiments of radio access node 300 may comprise additional components to provide additional functionality, such as the functionality described herein and/or related supporting functionality.

Reference is now made to FIG. 12B, which is a block schematic diagram that illustrates a radio access node according to some embodiments of the disclosed subject matter. A radio access node 300B comprises at least one module 350 configured to perform one or more corresponding functions. For example, methods herein may be performed using one or more of a linear encoding module 350A, a polar encoding module 350B, a polar decoding module 350C and a linear decoding module 350D. Examples of such functions include various method steps or combinations of method steps as described herein with reference to radio access node(s). In general, a module may comprise any suitable combination of software and/or hardware configured to perform the corresponding function. For instance, in some embodiments a module comprises software configured to perform a corresponding function when executed on an associated platform, such as that illustrated in FIG. 12A.

Figure 13:
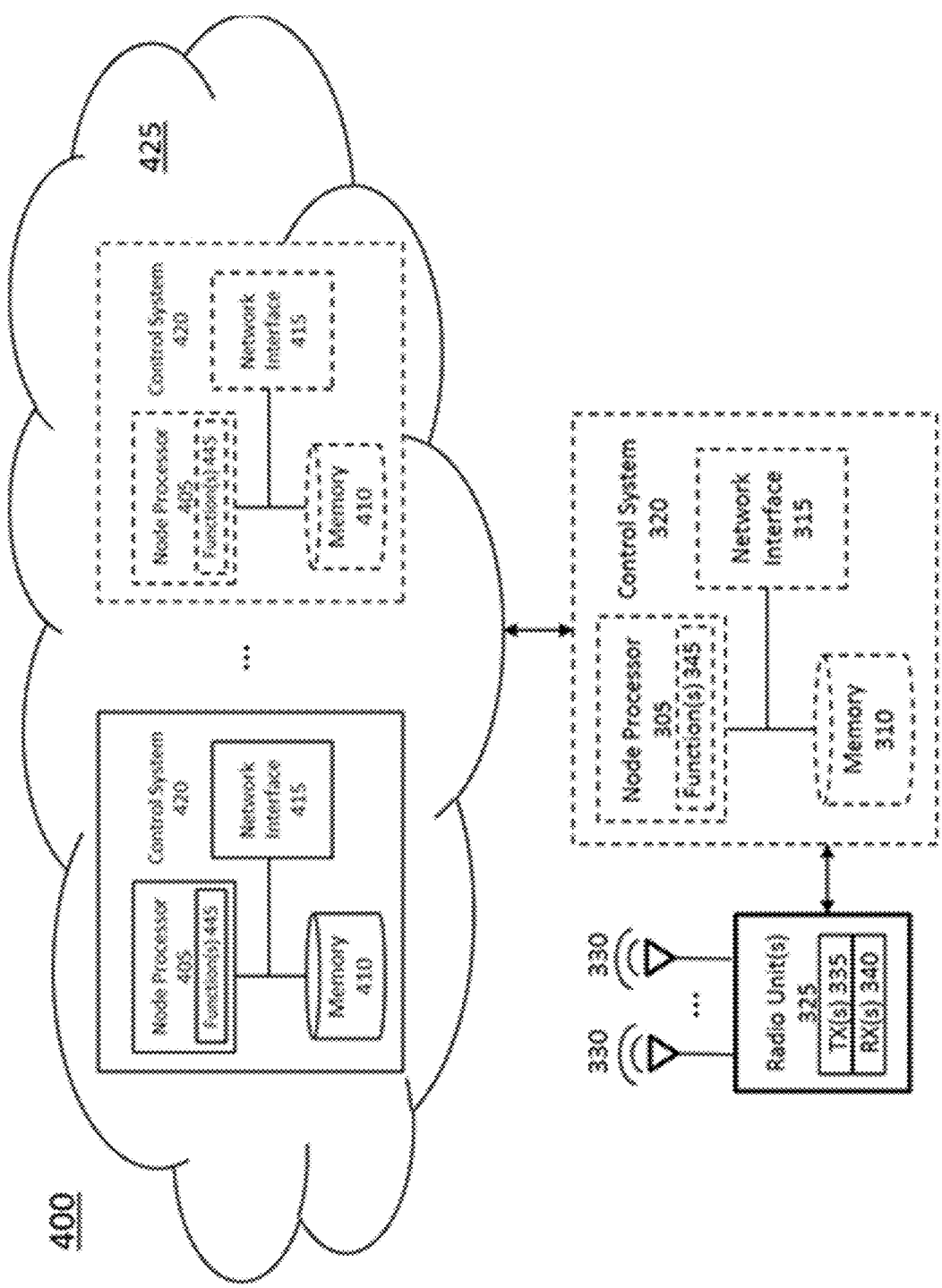
FIG. 13 is a block schematic diagram that illustrates a virtualized radio access node 400 according to some embodiments of the disclosed subject matter.

Reference is now made to FIG. 13, which is a block schematic diagram that illustrates a virtualized radio access node 400 according to some embodiments of the disclosed subject matter. The concepts described in relation to FIG. 13 may be similarly applied to other types of network nodes. Further, other types of network nodes may have similar virtualized architectures. As used herein, the term "virtualized radio access node" refers to an implementation of a radio access node in which at least a portion of the functionality of the radio access node is implemented as a virtual component(s) (e.g., via a virtual machine(s) executing on a physical processing node(s) in a network(s)).

Referring to FIG. 13, radio access node 400 comprises control system 320 as described in relation to FIG. 12A. Control system 320 is connected to one or more processing nodes 420 coupled to or included as part of a network(s) 425 via network interface 315. Each processing node 420 comprises one or more processors 405 (e.g., CPUs, ASICs, FPGAs, and/or the like), memory 410, and a network interface 415.

Some embodiments provide that functions 345 of radio access node 300A described herein are implemented at the one or more processing nodes 420 and/or distributed across control system 320 and the one or more processing nodes 420 in any desired manner. In some embodiments, some or all of the functions 345 of radio access node 300A described herein are implemented as virtual components executed by one or more virtual machines implemented in a virtual environment(s) hosted by processing node(s) 420. As will be appreciated by one of ordinary skill in the art, additional signaling or communication between processing node(s) 420 and control system 320 is used in order to carry out at least some of the desired functions 345. As indicated by dotted lines, in some embodiments control system 320 may be omitted, in which case the radio unit(s) 325 communicate directly with the processing node(s) 420 via an appropriate network interface(s).

In some embodiments, a computer program comprises instructions which, when executed by at least one processor, causes at least one processor to carry out the functionality of a radio access node (e.g., radio access node 110 or 300A) or another node (e.g., processing node 420) implementing one or more of the functions of the radio access node in a virtual environment according to any of the embodiments described herein.

Figure 14:
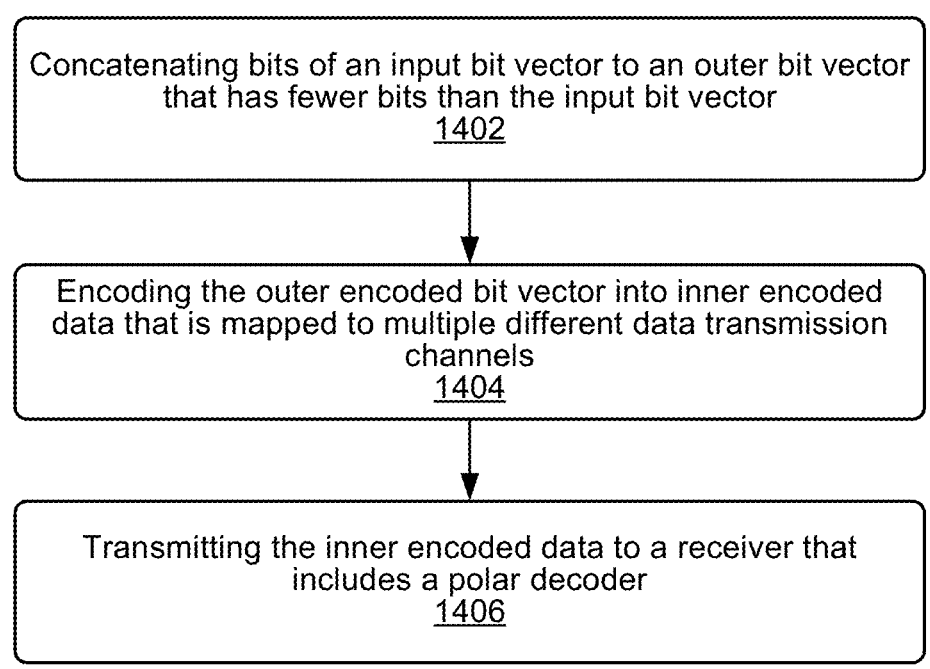
FIG. 14 is a block diagram illustrating operations for transmitting blocks of incremental redundant coded bits according to some embodiments of the disclosed subject matter.

Reference is now made to FIG. 14, which is a block diagram illustrating operations for transmitting blocks of incremental redundant coded bits. Operations include concatenating bits of an input bit vector to an outer encoded bit vector that has fewer bits than the input bit vector (block 1402). The concatenating may be performed using outer block encoder that may be a linear encoder according to some embodiments. In some embodiments, concatenating the bits of the input bit vector may be performed using a generating matrix that is used in a decoding operation at a receiver. For example, the generating matrix may be known to the encoder of the transmitter and the decoder of the receiver. The outer encoded bit vector may include a mixture of the information bits from the input bit vector.

In some embodiments, concatenating the bits of the input bit vector includes encoding less than all of the bits of the input bit vector using a generating matrix that may be known to a decoder in a receiver. In some embodiments, concatenating the bits of the input bit vector includes encoding all of the bits of the input bit vector using a random number.

Operations may include encoding the outer encoded bit vector into inner encoded data that is mapped to a plurality of data transmission channels (block 1404). The data transmission channels may each include a channel reliability value. Some embodiments provide a first portion of the data transmission channels is used to transmit information bits corresponding to the outer encoded bit vector and a second portion of the data transmission channels is used to transmit frozen bits that include no information.

Some embodiments provide that encoding the outer encoded data is performed using a polar encoder that encodes data for transmission using the data transmission channels. The polar encoder may identify specific ones of the data transmission channels as the high reliability data channels based on the reliability values corresponding to each channel. The high reliability data channels may be used to transmit information corresponding to the outer encoded vector. The other channels may be identified as low reliability data channels and may be used to transmit bits having no information, such as frozen bits.

Operations include transmitting the inner encoded data to a receiver that includes a polar decoder (block 1406). The polar decoder is configured decode the inner encoded data into outer encoded data at the receiver. The receiver may further include an outer decoder that is configured to decode the outer encoded data that is generated by the polar decoder. In some embodiments, transmitting the inner coded data includes multiple data transmissions that each include different information from one another. Some embodiments provide the different data transmissions are performed sequentially. In some embodiments, contents of a subsequent data transmission may be based on a performance of a previously performed data transmission. Some embodiments provide that the different data transmissions may be performed sequentially based on performing a later occurring data transmission in response to not receiving a message from a receiver of the first data transmission.

Figure 15:
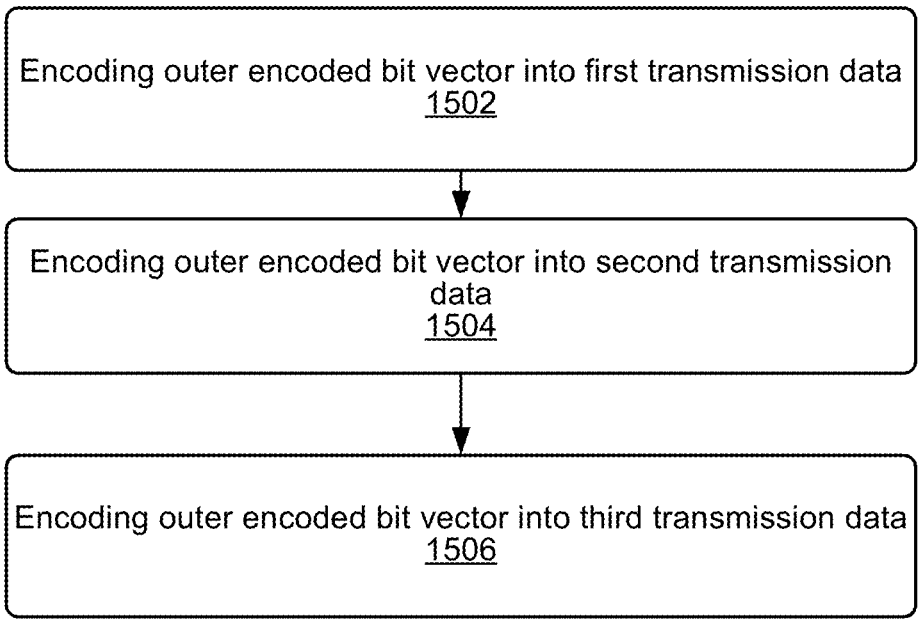
FIG. 15 is a block diagram illustrating operations for encoding the outer encoded bit vector according to some embodiments of the disclosed subject matter.

Reference is now made to FIG. 15, which is a block diagram illustrating operations for encoding the outer encoded bit vector according to some embodiments herein. Encoding the outer encoded bit vector into inner encoded data that is mapped to data transmission channels may include encoding the outer encoded bit vector into first transmission data (block 1502). According to some embodiments, the first transmission data is configured to be transmitted in a first data transmission. Operations may include encoding the outer encoded bit vector into second transmission data that is configured to be transmitted in a second data transmission (block 1504 and encoding the outer encoded bit vector into third transmission data that is configured to be transmitted in a third data transmission (block 1506).

Figure 16:
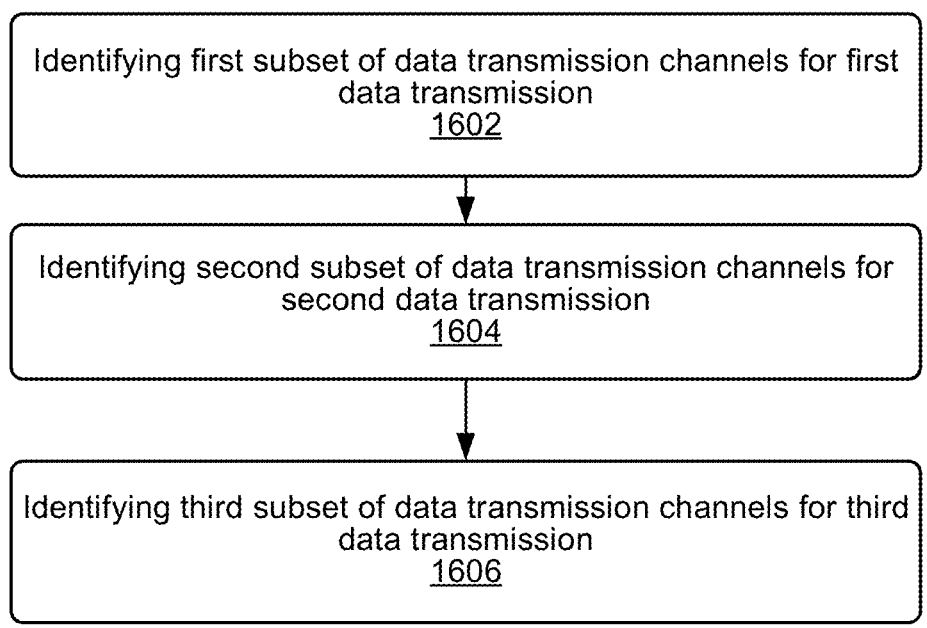
FIG. 16 is a block diagram illustrating operations for encoding the outer encoded bit vector according to some embodiments of the disclosed subject matter.

Reference is now made to FIG. 16, which is a block diagram illustrating operations for encoding the outer encoded bit vector according to some embodiments herein. Operations include identifying a first subset of data transmission channels for transmitting information bits in the first data transmission (block 1602). Operations further include identifying a second subset of data transmission channels for transmitting information bits in the second data transmission (block 1604) and identifying a third subset of data transmission channels for transmitting information bits in the third data transmission (block 1606). Some embodiments provide that the first subset of data transmission channels is different than the second and third subsets of data transmission channels. In some embodiments, the second and third subsets of data transmission channels are different from one another.

In some embodiments, a reliability value corresponding to the different data transmission channels may indicate a predicted reliability corresponding to the data transmission channels relative to one another. In some embodiments, the data transmission channels that are identified to use for information bits may be a fixed percentage of the total number of data transmission channels that are available that have the highest reliability values. In some embodiments, the reliability values of the data transmission channels may be compared to a given reliability threshold value and only those exceeding the reliability value threshold may be used for information bits.

Some embodiments provide that the second portion of the data transmission channels that is used to transmit frozen bits that include no information is encoded by a generating matrix that is known by a polar decoder at a receiver of the data transmission.

In some embodiments, the blocks of incremental redundant coded bits are used in a hybrid automatic repeat request (HARQ) re-transmission protocol to retransmit redundant information for the same block of information bits. Some embodiments provide that the blocks of incremental redundant coded bits are used in a transmission of broadcast information in a wireless communication system. In some embodiments, the transmission of broadcast information in a wireless communication system includes a system information block (SIB) of a 4G and/or 5G cellular system. Some embodiments provide that the blocks of incremental redundant coded bits are used in repeated transmission in uplink or downlink of a narrow-band internet of things (NB-IoT) system to extend coverage of the system.

Figure 17:
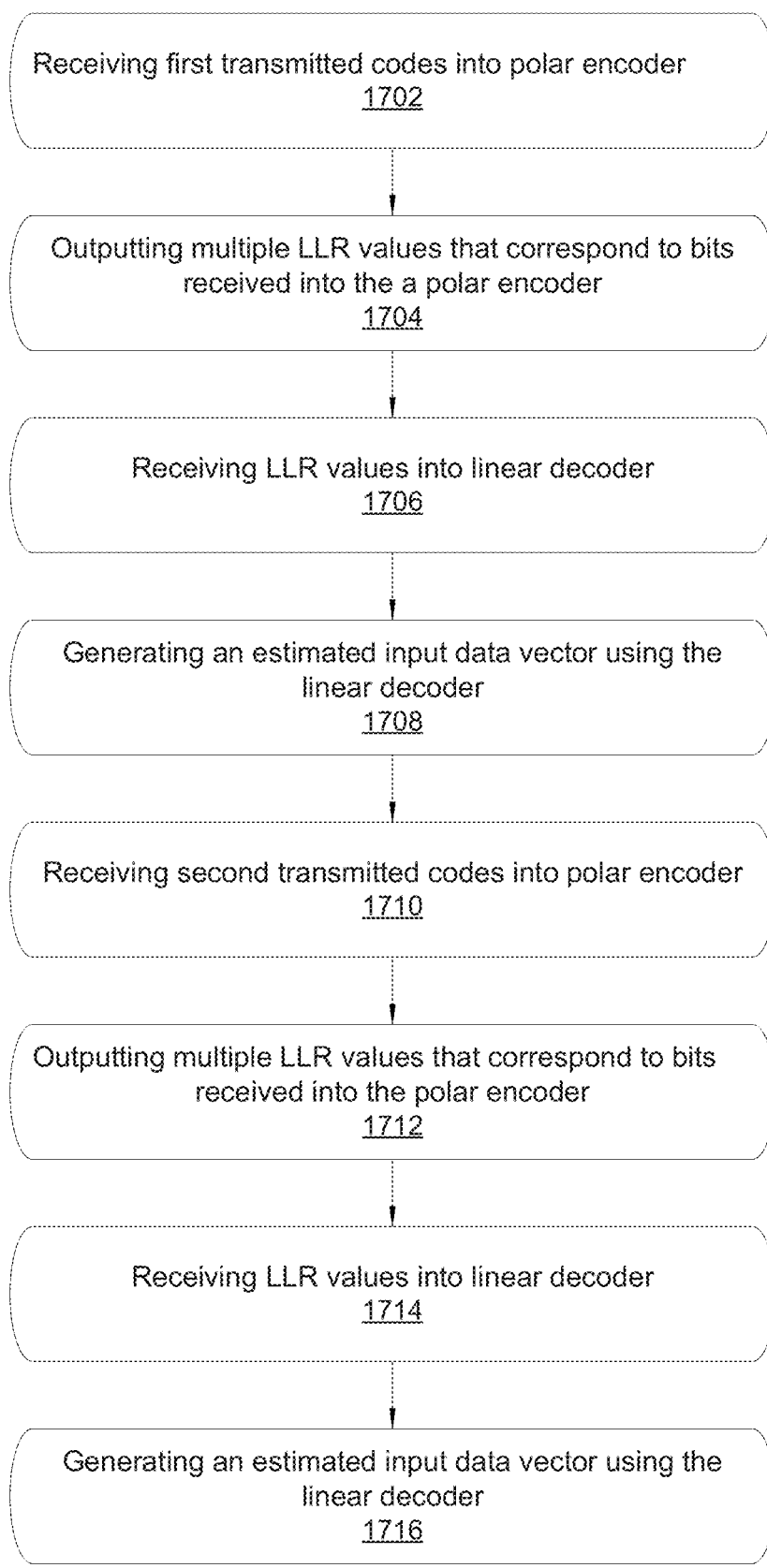
FIG. 17 is a block diagram illustrating operations for decoding information bits that are the outer encoded bit vector according to some embodiments of the disclosed subject matter.

Reference is now made to FIG. 17, which is a block diagram illustrating operations for decoding information bits that are the outer encoded bit vector according to some embodiments herein. Operations include receiving a plurality of first transmitted codes into a polar decoder (block 1702). The received codes may correspond to incremental redundant encoded bits that were transmitted to a receiver that includes the polar decoder. Operations may include outputting by the polar encoder a plurality of Log Likelihood Ratio (LLR) values that correspond to bits received into a polar encoder and that correspond to a likelihood of the corresponding one of the bits is correct (block 1704). Operations may include receiving the LLR values into a linear decoder (block 1706) and using the linear decoder to generate an estimated input data vector that corresponds to an input data vector received at a transmitter that transmitted the codes (block 1708).

According to embodiments herein, one or more re-transmissions of data may be performed. In such cases, operations may further include receiving second transmitted codes into the polar decoder (block 1710), outputting multiple Log Likelihood Ratio (LLR) values that correspond to the second transmission bits received into the polar encoder (block 1712), receiving the LLR values that correspond to the second transmitted codes into the linear decoder (block 1714) and generating an estimated input data vector that corresponds to an input data vector received at the transmitter that transmitted the second transmitted codes (block 1716).

As indicated by the foregoing, a central concept in certain embodiments is to add an outer (possibly linear) block code before the encoder of an inner Polar code before each transmission. The outer code mixes the input bits so that the number of input information bits that the input to the Polar encoder depends upon can be larger than the number of bits at the input of the Polar decoder. A different outer "mixing" code is used at a different transmission in such a way that the rank of their aggregated generating matrix has full rank, either deterministically or stochastically at high probabilities, so that all the input information bits are decodable at the receiver.

LIST OF ABBREVIATIONS eNB Enhanced Node B
LTE Long Term Evolution
LLR Log Likelihood Ratio
SIB System Information Block
IR Incremental Redundancy
HARQ Hybrid Automatic Repeat Request
NB-IoT Narrow Band—Internet of Things
MTC Machine Type Communications In the above-description of various embodiments of the present disclosure, it is to be understood that the terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When an element is referred to as being "connected", "coupled", "responsive", or variants thereof to another element, it can be directly connected, coupled, or responsive to the other element or intervening elements may be present. In contrast, when an element is referred to as being "directly connected", "directly coupled", "directly responsive", or variants thereof to another element, there are no intervening elements present. Like numbers refer to like elements throughout. Furthermore, "coupled", "connected", "responsive", or variants thereof as used herein may include wirelessly coupled, connected, or responsive. As used herein, the singular forms "a", "an" and "the" are intended to include the plural forms as well, unless the context clearly indicates otherwise. Well-known functions or constructions may not be described in detail for brevity and/or clarity. The term "and/or" includes any and all combinations of one or more of the associated listed items.

It will be understood that although the terms first, second, third, etc. may be used herein to describe various elements/operations, these elements/operations should not be limited by these terms. These terms are only used to distinguish one element/operation from another element/operation. Thus, a first element/operation in some embodiments could be termed a second element/operation in other embodiments without departing from the teachings of present inventive concepts. The same reference numerals or the same reference designators denote the same or similar elements throughout the specification.

As used herein, the terms "comprise", "comprising", "comprises", "include", "including", "includes", "have", "has", "having", or variants thereof are open-ended, and include one or more stated features, integers, elements, steps, components or functions but does not preclude the presence or addition of one or more other features, integers, elements, steps, components, functions or groups thereof. Furthermore, as used herein, the common abbreviation "e.g.", which derives from the Latin phrase "exempli gratia," may be used to introduce or specify a general example or examples of a previously mentioned item, and is not intended to be limiting of such item. The common abbreviation "i.e.", which derives from the Latin phrase "id est," may be used to specify a particular item from a more general recitation.

Example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

These computer program instructions may also be stored in a tangible computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random-access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/BlueRay).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks. Accordingly, embodiments of the present disclosure may be embodied in hardware and/or in software (including firmware, resident software, micro-code, etc.) that runs on a processor such as a digital signal processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated. Moreover, although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of various example combinations and subcombinations of embodiments and of the manner and process of making and using them, and shall support claims to any such combination or subcombination.

Many variations and modifications can be made to the embodiments without substantially departing from the principles of the present inventive concepts. All such variations and modifications are intended to be included herein within the scope of present inventive concepts. Accordingly, the above disclosed subject matter is to be considered illustrative, and not restrictive, and the examples of embodiments are intended to cover all such modifications, enhancements, and other embodiments, which fall within the spirit and scope of present inventive concepts. Thus, to the maximum extent allowed by law, the scope of present inventive concepts are to be determined by the broadest permissible interpretation of the present disclosure including the examples of embodiments and their equivalents, and shall not be restricted or limited by the foregoing detailed description.

What is claimed is:

1. A method of transmitting blocks of incremental redundant coded bits comprising:

concatenating, using an outer encoder, bits of an input bit vector to an outer encoded bit vector that, compared to a first data transmission, has fewer bits to be transmitted in a subsequent data transmission than the input bit vector used for the first data transmission, wherein the outer encoded bit vector includes a mixture of information bits from the input bit vector;

encoding the outer encoded bit vector into inner encoded data that is mapped to a plurality of data transmission channels that each include a channel reliability value, wherein a first portion of the plurality of data transmission channels is used to transmit information bits corresponding to the outer encoded bit vector and a second portion of the plurality of data transmission channels is used to transmit frozen bits that include known values, wherein encoding the outer encoded data comprises using a polar encoder that is operable to encode data for transmission using the plurality of data transmission channels, wherein the polar encoder is configured to identify ones of the plurality of data transmission channels as the first portion of data transmission channels and other ones of the plurality of data transmission channels as the second portion of the data transmission channels; and transmitting the inner encoded data to a receiver that includes a polar decoder that is configured decode the inner encoded data into outer encoded data and an outer decoder that is configured to decode the outer encoded data that is generated by the polar decoder, wherein transmitting the inner coded data comprises transmitting incremental redundant information over a plurality of data transmissions that each include different information from one another, and wherein for different data transmissions, a different outer mixing code is used by the outer encoder for mixing the input information bits from the input bit vector, so that the number of input information bits that affect the input to the Polar encoder is larger than the number of bits at the input of the Polar decoder, and so that each information bit from the input bit vector is coded across multiple data transmissions.

2. The method claim 1, wherein ones of the plurality of data transmissions are performed sequentially, wherein contents of a subsequent one of the plurality of data transmissions are based on a performance of a previously performed one of the plurality of data transmissions.

3. The method of claim 1, wherein ones of the plurality of data transmissions are performed sequentially, wherein one of the plurality of data transmissions occurring after a first data transmission is performed responsive to not receiving a message from a receiver acknowledging the first data transmission.

4. The method of claim 1, wherein encoding the outer encoded bit vector into inner encoded data that is mapped to a plurality of data transmission channels comprises:
   encoding the outer encoded bit vector into first transmission data that is configured to be transmitted in a first data transmission;
   encoding the outer encoded bit vector into second transmission data that is configured to be transmitted in a second data transmission; and
   encoding the outer encoded bit vector into third transmission data that is configured to be transmitted in a third data transmission.

5. The method of claim 4, wherein encoding the outer encoded bit vector into inner encoded data further comprises:
   identifying a first subset of the plurality of data transmission channels as the first portion of the plurality of data transmission channels for the first data transmission;
   identifying a second subset of the plurality of data transmission channels as the first portion of the plurality of data transmission channels for the second data transmission; and
   identifying a third subset of the plurality of data transmission channels as the first portion of the plurality of data transmission channels for the third data transmission,
   wherein the first subset of the plurality of data transmission channels is different than the second and third subsets of the plurality of data transmission channels, and
   wherein the second and third subsets of the plurality of data transmission channels are different from one another.

6. The method of claim 1, wherein a reliability value corresponding to ones of the plurality of data transmission channels indicates a predicted reliability corresponding to the ones of the plurality of data transmission channels.

7. The method of claim 1, wherein concatenating the bits of the input bit vector is performed using a generating matrix that is used in a decoding operation at a receiver.

8. The method of claim 1, wherein the second portion of the data transmission channels that is used to transmit frozen bits that include no information is encoded by a generating matrix that is known by a polar decoder at a receiver of the data transmission.

9. The method of claim 1, wherein concatenating the bits of the input bit vector comprises encoding less than all of the bits of the input bit vector using a generating matrix.

10. The method of claim 1, wherein concatenating the bits of the input bit vector comprises encoding all of the bits of the input bit vector using a random number.

11. The method of claim 1, wherein the blocks of incremental redundant coded bits are used in one of:
   a hybrid automatic repeat request (HARQ) re-transmission protocol to retransmit redundant information for the same block of information bits, or
   a transmission of broadcast information in a wireless communication system.

12. The method of claim 1, wherein the blocks of incremental redundant coded bits are used in a transmission of broadcast information in a wireless communication system.

13. The method of claim 1, wherein the blocks of incremental redundant coded bits are used in repeated transmission in uplink or downlink of a narrow-band internet of things (NB-IoT) system to extend coverage of the system.

14. The method of claim 1, wherein the first portion of the plurality of data transmission channels comprises ones of the plurality of data transmission channels that include reliability values that are greater than reliability values of the second portion of the plurality of data transmission channels.

15. The method of claim 1, wherein the first portion of the plurality of data transmission channels are a given percentage of a total number of the plurality of data transmission channels.

16. The method of claim 1, wherein the first portion of the plurality of data transmission channels comprises ones of the plurality of data transmission channels that include reliability values that are greater than a given reliability threshold.

17. A communication device comprising:
   a processor;
   a memory containing instructions that, when executed by the processor, cause the communication device to transmit blocks of incremental redundant coded bits by carrying out a method comprising:
   concatenating
   using an outer encoder, bits of an input bit vector to an outer encoded bit vector that, compared to a first data transmission, has fewer bits to be transmitted in a subsequent data transmission than the input bit vector used for the first data transmission, wherein the outer encoded bit vector includes a mixture of information bits from the input bit vector;
   encoding the outer encoded bit vector into inner encoded data that is mapped to a plurality of data transmission channels that each include a channel reliability value, wherein a first portion of the plurality of data transmission channels is used to transmit information bits corresponding to the outer encoded bit vector and a second portion of the plurality of data transmission channels is used to transmit frozen bits that include known values, wherein encoding the outer encoded data comprises using a polar encoder that is operable to encode data for transmission using the plurality of data transmission channels, wherein the polar encoder is configured to identify ones of the plurality of data transmission channels as the first portion of data transmission channels and other ones of the plurality of data transmission channels as the second portion of the data transmission channels; and
   transmitting the inner encoded data to a receiver that includes a polar decoder that is configured decode the inner encoded data into outer encoded data and an outer decoder that is configured to decode the outer encoded data that is generated by the polar decoder, wherein transmitting the inner coded data comprises transmitting incremental redundant information over a plurality of data transmissions that each include different information from one another, and wherein for different data transmissions, a different outer mixing code is used by the outer encoder for mixing the input information bits from the input bit vector, so that the number of input information bits that affect the input to the Polar encoder is larger than the number of bits at the input of the Polar decoder, and so that each information bit from the input bit vector is coded across multiple data transmissions.

* * * * *